(12) United States Patent
Bok et al.

(10) Patent No.: US 10,868,088 B2
(45) Date of Patent: Dec. 15, 2020

(54) DISPLAY DEVICE

(71) Applicant: SAMSUNG DISPLAY CO., LTD., Yongin-si (KR)

(72) Inventors: Seung Lyong Bok, Hwaseong-si (KR); Joon Gu Lee, Seoul (KR); Ki Cheol Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/740,885

(22) Filed: Jan. 13, 2020

(65) Prior Publication Data
US 2020/0266246 A1    Aug. 20, 2020

(30) Foreign Application Priority Data
Feb. 20, 2019    (KR) .................. 10-2019-0019707

(51) Int. Cl.
| | |
|---|---|
| *H01L 27/32* | (2006.01) |
| *H01L 51/52* | (2006.01) |
| *G06F 3/041* | (2006.01) |
| *H01L 51/00* | (2006.01) |
| *G06K 9/00* | (2006.01) |

(52) U.S. Cl.
CPC .......... *H01L 27/323* (2013.01); *G06F 3/0412* (2013.01); *H01L 27/3234* (2013.01); *H01L 27/3246* (2013.01); *H01L 27/3272* (2013.01); *H01L 27/3276* (2013.01); *H01L 51/0097* (2013.01); *H01L 51/5228* (2013.01); *G06F 2203/04103* (2013.01); *G06K 9/00013* (2013.01); *H01L 2251/5338* (2013.01)

(58) Field of Classification Search
CPC ............... H01L 27/323; H01L 27/3246; H01L 27/3234; H01L 51/5228; H01L 27/3276; H01L 51/0097; H01L 2251/5338
See application file for complete search history.

(56) References Cited

U.S. PATENT DOCUMENTS

| | | |
|---|---|---|
| 8,390,582 B2 | 3/2013 | Hotelling et al. |
| 9,231,211 B2 | 1/2016 | Lee et al. |
| 9,418,626 B2 | 8/2016 | Reynolds |
| 9,430,180 B2 | 8/2016 | Hirakata et al. |
| 2017/0236877 A1 | 8/2017 | Jeong |
| 2018/0211998 A1 | 7/2018 | Hideo et al. |

FOREIGN PATENT DOCUMENTS

| | | |
|---|---|---|
| KR | 10-2020-0077663 | 7/2020 |
| WO | 2020130368 | 6/2020 |

*Primary Examiner* — Anthony Ho
(74) *Attorney, Agent, or Firm* — F. Chau & Associates, LLC

(57) ABSTRACT

A display device is provided. The display device includes a substrate including an active region in which a plurality of pixels are arranged; a first electrode layer disposed on the substrate and including a first electrode disposed in each pixel and an auxiliary electrode spaced apart from the first electrode and disposed along a boundary of each pixel; an intermediate layer disposed on the first electrode and including a light emitting layer; and a second electrode disposed on the intermediate layer, disposed in each pixel, and electrically connected to the auxiliary electrode; wherein a plurality of unit pixel groups, each including one or more pixels, are defined on the substrate, the respective second electrodes of the pixels belonging to each unit pixel group are electrically connected to each other by the auxiliary electrode, and the auxiliary electrodes belonging to different unit pixel groups are electrically separated from each other.

20 Claims, 25 Drawing Sheets

DISPLAY DEVICE

CROSS-REFERENCE TO RELATED APPLICATION

This application claims priority under 35 U.S.C. § 119 to Korean Patent Application No. 10-2019-0019707, filed on Feb. 20, 2019 in the Korean Intellectual Property Office, the disclosure of which is incorporated by reference herein in its entirety.

BACKGROUND

1. Field

The present invention relates to a display device, and more particularly, to a display device including a touch function.

2. Description of the Related Art

Electronic devices that provide images to a user, such as smartphones, tablet PCs, digital cameras, notebook computers, navigation devices and smart televisions, include a display device for displaying images. A display device includes a display panel for generating and displaying images and various input devices.

Recently, a touch member that recognizes a touch input has been widely applied to display devices mainly in smartphones or tablet PCs. The touch member determines whether a touch input has been made and calculates the touch position as coordinates of the touch input. The touch member may be provided in the form of a panel or a film or may be directly formed in the display panel.

As the number of parts included in a display device increases, manufacturing costs may increase. Also, in the case of a method of forming a touch electrode layer in a display panel, the structure of the display panel may become complicated, and process efficiency may be reduced because a manufacturing process for forming the touch electrode layer is added.

SUMMARY

The present invention is not limited to the one set forth herein. The present invention will become more apparent to one of ordinary skill in the art to which the present invention pertains by referencing the detailed description of the present disclosure given below.

An embodiment of a display device includes a substrate which comprises an active region in which a plurality of pixels are arranged; a first electrode layer which is disposed on the substrate and comprises a first electrode disposed in each pixel and an auxiliary electrode spaced apart from the first electrode and disposed along a boundary of each pixel; an intermediate layer which is disposed on the first electrode and comprises a light emitting layer; and a second electrode which is disposed on the intermediate layer, disposed in each pixel, and electrically connected to the auxiliary electrode; and wherein a plurality of unit pixel groups, each comprising one or more pixels, are defined on the substrate, the respective second electrodes of the pixels belonging to each unit pixel group are electrically connected to each other by the auxiliary electrode, and the auxiliary electrodes belonging to different unit pixel groups are electrically separated from each other.

An embodiment of a display device includes a substrate which comprises an active region in which a plurality of pixels are arranged; a light emitting element which is disposed on the substrate, is disposed in each pixel, and comprises a first electrode, an intermediate layer and a second electrode; and a plurality of touch electrodes which are disposed over the pixels, wherein the first electrode, the intermediate layer and the second electrode are patterned to be separate for each pixel, and each of the touch electrodes comprises a plurality of second electrodes.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, specific embodiments will be described with reference to the attached drawings.

Figure 1:
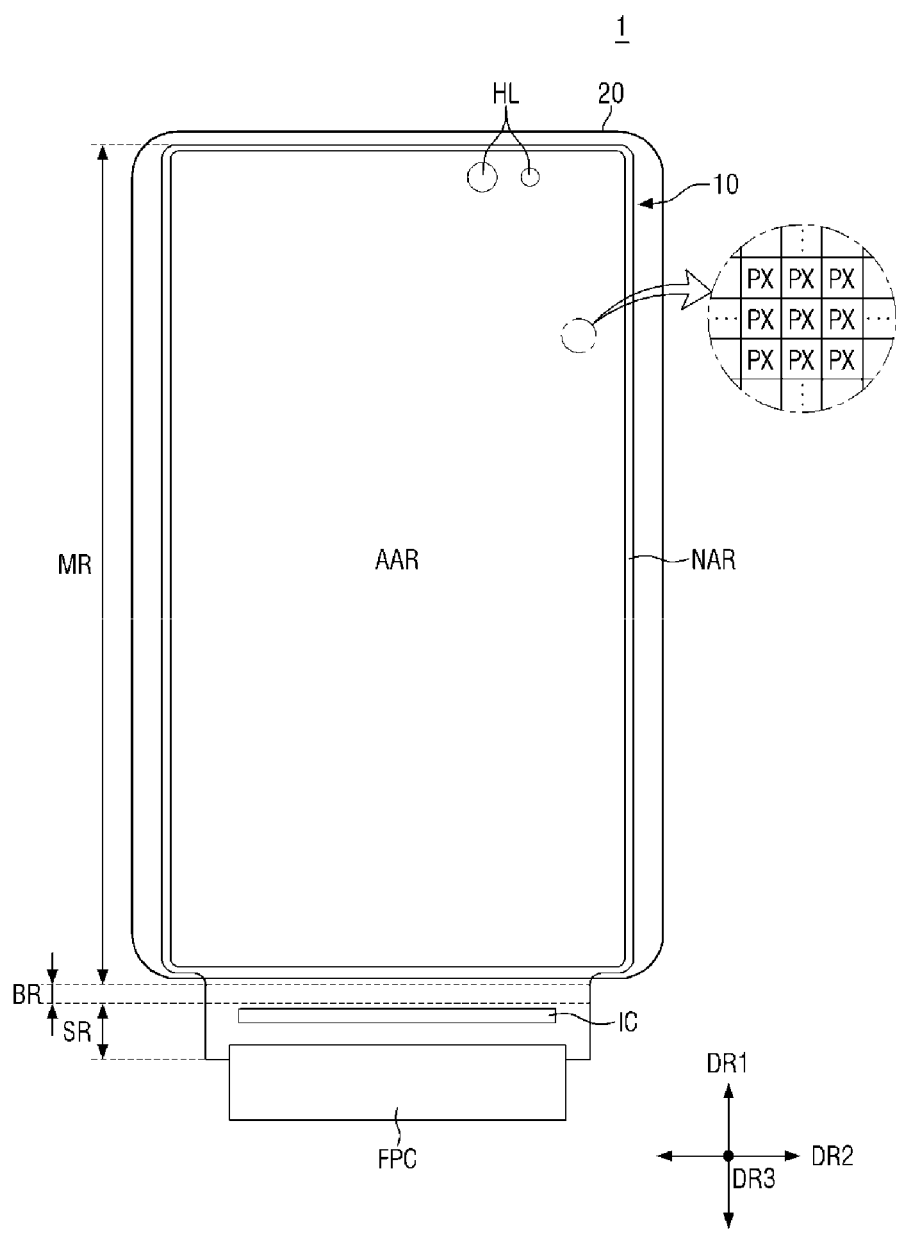
FIG. 1 is a plan layout view of a display device according to an embodiment.
Figure 2:
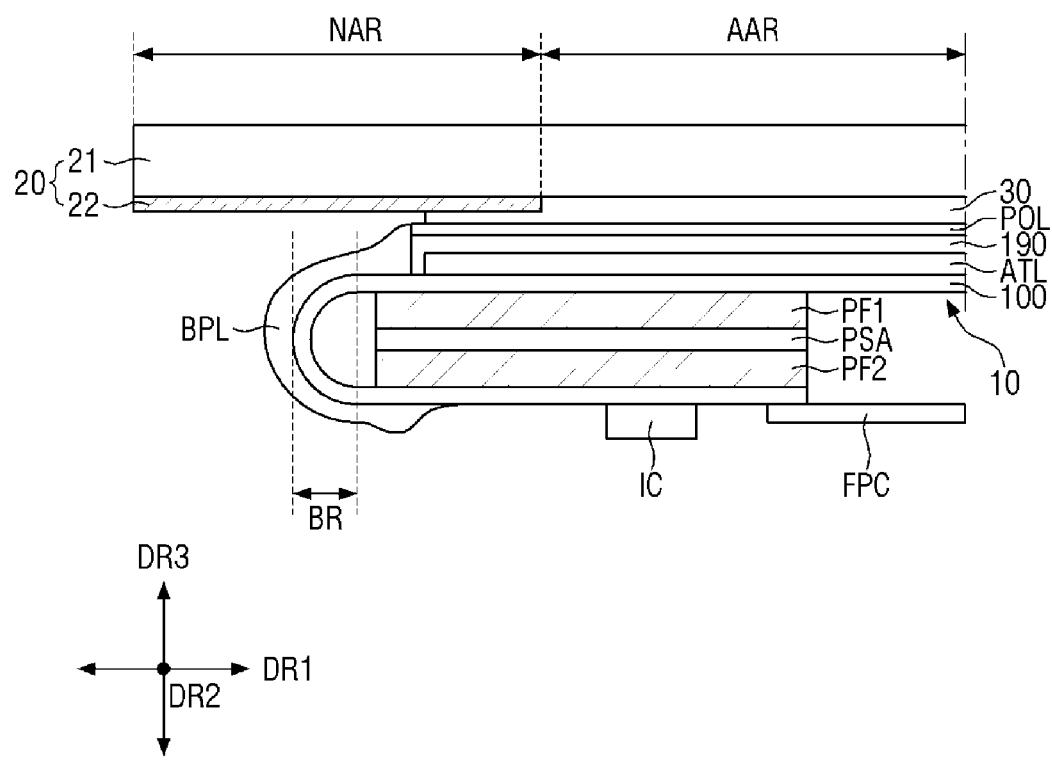
FIG. 2 is a schematic partial cross-sectional view of the display device according to the embodiment.

FIG. 1 is a plan layout view of a display device 1 according to an embodiment. FIG. 2 is a schematic partial cross-sectional view of the display device 1 according to an embodiment.

In embodiments, a first direction DR1 and a second direction DR2 are different directions intersecting each other, for example, directions perpendicularly intersecting each other in a plan view. A third direction DR3 is a direction intersecting the plane in which the first direction DR1 and the second direction DR2 lie, for example, a direction perpendicularly intersecting both the first direction DR1 and the second direction DR2. In the drawings, the first direction DR1 indicates a vertical direction of the display device 1, the second direction DR2 indicates a horizontal direction of the display device 1, and the third direction DR3 indicates a thickness direction of the display device 1. In the following embodiments, a first side in the first direction DR1 refers to an upward direction in a plan view, a second side in the first direction DR1 refers to a downward direction in a plan view, a first side in the second direction DR2 refers to a right direction in a plan view, a second side in the second direction DR2 refers to a left direction in a plan view, a first side in the third direction DR3 refers to an upward direction in cross-sectional view, and a second side in the third direction DR3 refers to a downward direction in cross-sectional view. However, directions mentioned in embodiments should be understood as relative directions, and the embodiments are not limited to the mentioned directions.

Referring to FIGS. 1 and 2, the display device 1 may display moving images or still images. A display direction of a main screen may be the first side in the third direction DR3 (e.g., a top emission display device). The present invention is not limited thereto. The display direction of the main screen may be the second side in the third direction DR3 (e.g., a bottom emission display device). In an example embodiment, the display direction of the main screen may be both the first and second sides in the third direction DR3 (e.g., a double-side emission display device or a transparent display device).

The display device 1 may refer to any electronic device that provides a display screen. Examples of the display device 1 may include portable electronic devices that provide a display screen, such as a mobile phone, a smartphone, a tablet personal computer (PC), an electronic watch, a smart watch, a watch phone, a mobile communication terminal, an electronic notebook, an electronic book, a portable multimedia player (PMP), a navigation device, a game machine and a digital camera, as well as a television, a notebook, a monitor, a billboard and the Internet of things.

The display device 1 includes an active region AAR and a non-active region NAR. In the display device 1, a portion in which a screen is displayed may be defined as a display region, a portion in which no screen is displayed may be defined as a non-display region, and a region in which a touch input is sensed may be defined as a touch region. In this case, the display region and the touch region may be included in the active region AAR. The display region and the touch region may overlap each other. That is, the active region AAR may be a region where a screen is displayed and a touch input is sensed. The active region AAR may be shaped like a rectangle or a rectangle with rounded corners. The active region AAR shown in the drawings is shaped like a rectangle that has rounded corners and is longer in the first direction DR1 than in the second direction DR2. However, embodiments are not limited to this case, and the active region AAR may have various shapes such as a rectangle that is longer in the second direction DR2 than in the first direction DR1 or a square or other polygons or a circle or an ellipse.

The non-active region NAR is disposed around the active region AAR. The non-active region NAR may be referred to as a bezel region. The non-active region NAR may overlap a print layer 22 of a window member 20 to be described later.

The non-active region NAR surrounds all sides (four sides in the drawings) of the active region AAR. However, embodiments are not limited to this case. For example, the non-active region NAR may not be disposed around an upper side of the active region AAR.

In the non-active region NAR, signal wirings or driving circuits for transmitting signals to the active region AAR (the display region or the touch region) may be disposed. The non-active region NAR may not include the display region. Further, the non-active region NAR may not include the touch region. The present invention is not limited thereto. In an embodiment, the non-active region NAR may include a portion of the touch region or a sensor member such as a pressure sensor. In some embodiments, the active region AAR may be exactly the same as the display region where a screen is displayed, and the non-active region NAR may be exactly the same as the non-display region where no screen is displayed.

In an embodiment, the display device 1 further includes one or more hole regions HL. The hole regions HL are disposed on a first side of the display device 1 in the first direction DR1. The hole regions HL are surrounded by the active region AAR as shown in FIG. 1. In another example, the hole regions HL may be surrounded by the non-active region NAR or may be disposed around a boundary between the active region AAR and the non-active region NAR such that a portion of each of the hole regions HL is surrounded by the active region AAR and the other portion is surrounded by the non-active region NAR. The display device 1 may further include an optical element such as a camera or a lens overlapping each of the hole regions HL. Each of the hole regions HL is circular in a plan view (that is, when seen from above). However, the shape of each of the hole regions HL is not limited to the circular shape and may be changed to various shapes such as a rectangle, a square and other polygons.

The display device 1 includes a display panel 10 that provides a display screen. Examples of the display panel 10 may include an organic light emitting display panel, a micro light emitting diode (LED) display panel, a nano LED display panel, a quantum dot light emitting display panel, a liquid crystal display panel, a plasma display panel, a field emission display panel, an electrophoretic display panel, or an electrowetting display panel. A case where an organic light emitting display panel is applied as an example of the display panel 10 will be described below, but embodiments are not limited to this case, and the present invention may apply to other display panels as long as the same technical spirit is applicable.

The display panel 10 includes a plurality of pixels PX. The pixels PX may be arranged in a matrix form. Each of the pixels PX may be rectangular or square in a plan view. However, the planar shape of each of the pixels PX is not limited to the above examples. In an example embodiment, the planar shape of each of the pixels PX may be a rhombic shape having each side inclined with respect to the first direction DR1. Each of the pixels PX may include a light emitting region. The light emitting region may have the same shape as a corresponding pixel of the pixels PX. The present invention is not limited thereto. In an example embodiment, the light emitting region may have a different shape from a corresponding pixel of the pixels PX. For example, when a pixel has a rectangular shape, a light emitting region of the pixel may have various shapes such as a rhombus, a hexagon, an octagon and a circle. The pixels PX and a light emitting region of a corresponding pixel will be described in detail later.

The display device 1 may further include a touch member that senses a touch input. The touch member may be integrated into the display panel 10. In an embodiment in which the touch member is integrated into the display panel 10, electrodes or wirings of the display panel 10 may also be used as touch electrodes or touch sensing wirings. This will be described in detail later.

In some embodiments, a touch panel, a touch film, etc. other than the integrated touch member may be further added to the display panel 10.

The display panel 10 may include a substrate 100 including a flexible polymer material such as polyimide. The substrate 100 may be flexible. Accordingly, the display panel 10 may be bent, curved, folded, or rolled.

The display panel 10 includes a bending region BR where the display panel 10 is bent. With respect to the bending region BR, the display panel 10 is divided into a main region MR located on a side of the bending region BR and a sub region SR located on the other side of the bending region BR.

The display region of the display panel 10 is disposed in the main region MR. In an embodiment, an edge portion around the display region in the main region MR, the whole of the bending region BR, and the whole of the sub region SR may be the non-display region. However, the bending region BR and/or the sub region SR may include a display region in addition to the display region of the main region MR.

The shape of the main region MR may be substantially similar to the planar shape of the display device 1. The main region MR may be a flat region located in one plane. However, embodiments are not limited to this case. In an example embodiment, at least one of edges of the main region MR excluding an edge (side) connected to the bending region BR may be curved or may be bent perpendicularly.

When at least one of the edges of the main region MR excluding the edge (side) connected to the bending region BR is curved or bent, the display region may also be disposed at the curved or bent edge. However, embodiments are not limited to this case. In an example embodiment, the curved or bent edge may be the non-display region where no screen is displayed or may include a combination of the display region and the non-display region.

The display panel 10 includes an active element layer ATL and a thin-film encapsulation layer 190 that are disposed in the main region MR. The active element layer ATL may include light emitting elements and touch electrodes. This will be described in detail later. The thin-film encapsulation layer 190 covers the active element layer ATL to prevent the active element layer ATL from being exposed to moisture or air.

The display panel 10 further includes a polarizing member POL. The polarizing member POL may be provided in the form of a polarizing film or a polarizing layer. The polarizing member POL may be attached onto the thin-film encapsulation layer 190. The polarizing member POL is disposed in the main region MR. The present invention is not limited thereto. In an example embodiment, the polarization member POL may be further disposed in the bending region BR or the sub region SR. The polarizing member POL may be omitted.

The bending region BR is connected to the second side of the main region MR in the first direction DR1. For example, the bending region BR is connected to a lower short side of the main region MR. The width of the bending region BR is smaller than the width of (the short side of) the main region MR. A connection portion between the main region MR and the bending region BR may have an L-cut shape.

In the bending region BR, the display panel 10 may be bent from the second side with a curvature. The surface normal of the bent surface of the display panel 10 may vary gradually from the third direction DR3 to an opposite one of the third direction DR or to a direction between the third direction DR3 and the first direction DR1. The bending region BR may have a constant radius of curvature. However, embodiments are not limited to this case. In an example embodiment, the bending region BR may have a different radius of curvature in each section. As the display panel 10 is bent in the bending region BR, a surface normal of the display panel 10 may change, for example, from an upward surface direction to a downward surface direction. The surface normal is defined as a normal direction of a surface. For example, the surface of the display panel 10 may face upward, face outward through the bending region BR and then face downward.

A bending protection layer BPL disposed on a surface of the substrate 100 is disposed in the bending region BR. The bending protection layer BPL may be made of, e.g., resin to protect the bending region BR. The bending protection layer BPL is further disposed in a portion of the main region MR and a portion of the sub region SR adjacent to the bending region BR. In an example embodiment, the bending protection layer BPL may completely overlap the bending region and partially overlap the sub region SR and the main region MR.

The sub region SR extends from the bending region BR. The sub region SR may extend parallel to the main region MR after the completion of bending. For example, the sub region SR overlaps the main region MR in the third direction DR3, that is, in the thickness direction of the display panel 10. The width of the sub region SR (in the second direction DR2) may be, but not necessarily, the same as the width of the bending region BR. In an example embodiment, the width of the bending region BR may be gradually reduced, and where the bending region BR and the sub region SR meet each other, the width of the bending region BR may be the same as the width of the sub region SR. In an example embodiment, where the bending region BR and the sub region SR meet each other, the width of the bending region BR may be greater or smaller than the width of the sub region SR. A driver chip IC is disposed in the sub region SR. The driver chip IC may include an integrated circuit for driving the display panel 10. The integrated circuit may include an integrated circuit for a display and/or an integrated circuit for a touch unit. The integrated circuit for a display and the integrated circuit for a touch unit may be provided as separate chips or may be integrated into one chip.

A pad unit may be disposed at an end of the sub region SR of the display panel 10. The pad unit may include a plurality of display signal wiring pads and a plurality of touch signal wiring pads. A driving substrate FPC may be connected to the pad unit at the end of the sub region SR of the display panel 10. The driving substrate FPC may be a flexible printed circuit board or film.

The display panel 10, after the completion of bending, further includes protective films disposed in an overlap region between the main region MR and the sub region SR. For example, a first protective film PF1 is attached to a surface of the substrate 100 in the main region MR, and a second protective film PF2 is attached to a surface of the substrate 100 in the sub region SR. The first protective film PF1 and the second protective film PF2 face each other and are bonded together by an adhesive layer or a bonding layer PSA. Accordingly, the mechanical stability of the bending structure may be increased.

The display device 1 further includes the window member 20. The window member 20 covers and protects the display panel 10. The window member 20 includes a window base 21 and the print layer 22 disposed on the window base 21.

The window base 21 may be made of a transparent material. The window base 21 may include, for example, glass or plastic. When the window base 21 includes plastic, it may be flexible.

Examples of the plastic applicable to the window base 21 may include, but are not limited to, polyimide, polyacrylate, polymethyl methacrylate (PMMA), polycarbonate (PC), polyethylene naphthalate (PEN), polyvinylidene chloride, polyvinylidene difluoride (PVDF), polystyrene, ethylene vinylalcohol copolymer, polyethersulphone (PES), polyetherimide (PEI), polyphenylene sulfide (PPS), polyallylate, triacetyl cellulose (TAC), or cellulose acetate propionate (CAP). The window base 21 may include one or more of the plastic materials listed above. When the window base 21 includes plastic, the window member 20 may further include a coating layer (not shown) disposed on upper and lower surfaces of the window base 21. In an embodiment, the coating layer may be a hard coating layer including an organic layer containing an acrylate compound and/or an organic-inorganic hybrid layer.

The planar shape of the window base 21 may correspond to the shape of the display device 1 to which the window base 21 is applied. For example, when the display device 1 is substantially rectangular in a plan view, the window base 21 may also be substantially rectangular. For another example, when the display device 1 is circular, the window base 21 may also be circular.

The window base 21 may be larger than the display panel 10 in a plan view, and its side surfaces may protrude from or extend outward beyond side surfaces of the display panel 10. The window base 21 may protrude outward from all sides (four sides in the drawings) of the display panel 10.

The print layer 22 is disposed on the window base 21. The print layer 22 may be disposed on a surface and/or the other surface of the window base 21. The print layer 22 is disposed on an edge portion of the window base 21 and disposed in the non-active region NAR. The print layer 22 may be a decorative layer for aesthetic purposes and/or an outermost black matrix layer.

The pixel structure of the display panel 10 will now be described in more detail.

Figure 3:
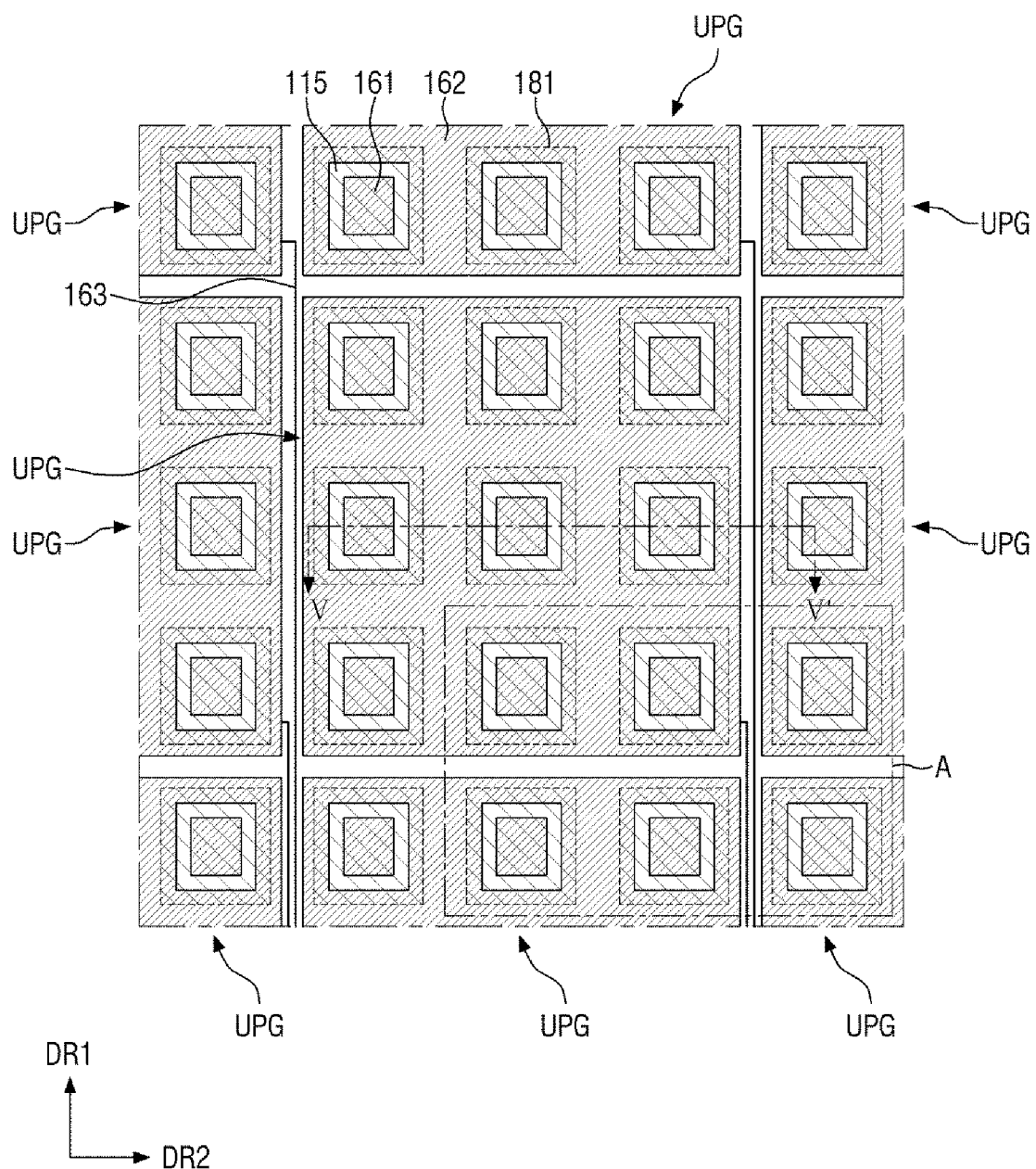
FIG. 3 is a layout view of a display panel according to an embodiment.
Figure 4:
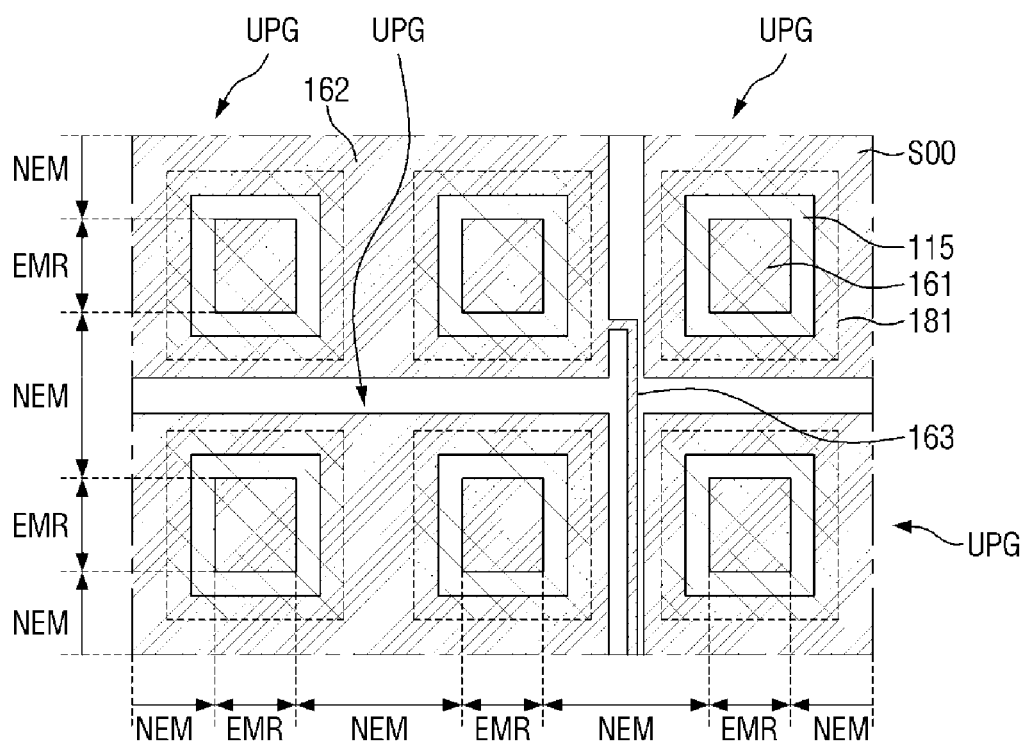
FIG. 4 is an enlarged view of a region A of FIG. 3.

FIG. 3 is a layout view of a display panel 10 according to an embodiment. FIG. 4 is an enlarged view of a region A of FIG. 3.

Referring to FIGS. 1, 3 and 4, the display panel 10 includes a plurality of pixels PX. The pixels PX are arranged in a matrix form. In an example embodiment, each of the pixels PX may include a first electrode 161 and a second electrode 181. The pixels PX may include first color pixels, second color pixels, or third color pixels. The first color pixels may be red pixels, the second color pixels may be green pixels, and the third color pixels may be blue pixels. In an embodiment, the pixels PX may be arranged in a stripe pattern in which a column of pixels of the same color is arranged in the first direction DR1 (i.e., in a column direction), and a column of pixels having red pixels, a column of pixels having green pixels and a column of pixels having blue pixels may be alternately arranged in this order in the second direction DR (i.e., a row direction). However, the arrangement of the pixels PX is not limited to this example. In an example embodiment, each of the pixels PX may be formed in a rhombic shape, and the pixels PX may be arranged in a pentile pattern in which red and blue pixels are radially arranged around a green pixel. In addition, the pixels PX may include white pixels in addition to red, green and blue pixels.

Each of the pixels PX includes a light emitting region EMR. The light emitting region EMR may be a region in which a light emitting layer of an intermediate layer emits light and may be defined as a region in which the first electrode 161 corresponding to a pixel electrode of each of the pixels PX is exposed by a bank layer 115 in a plan view. The bank layer 115 may be referred to as a pixel defining layer. A region surrounding the light emitting region EMR may be referred to as a non-light emitting region NEM in which a light emitting layer is not present or does not emit light. The light emitting region EMR of a first color pixel may emit light of a first color, the light emitting region EMR of a second color pixel may emit light of a second color, and the light emitting region EMR of a third color pixel may emit light of a third color. However, embodiments are not limited to this case. In an example embodiment, the light emitting region EMR of each of the pixels PX may emit light of the same color, and a color filter and/or a wavelength conversion layer may be disposed on the path of light to output the color of a corresponding pixel of the pixels PX.

An auxiliary electrode 162 and/or an electrode wiring 163 are disposed in the non-light emitting region NEM which is defined as a region between two adjacent light emitting regions. In a plan view, the first electrode 161 is surrounded by the bank layer 115. The bank layer 115 forms a closed loop. The auxiliary electrode 162 surrounds the first electrode 161 and the bank layer 115 in a plan view. The bank layer 115 is disposed between the first electrode 161 and the auxiliary electrode 162. The auxiliary electrode 162 is spaced apart from the first electrode 161 and extends across the perimeter of the second electrode 181. The auxiliary electrode 162 may have a lattice pattern. In an example embodiment, the auxiliary electrode 162 surrounds nine bank layers in a plane view. The present invention is not limited thereto. In an example embodiment, the auxiliary electrode 162 may surround more than or less than nine bank layers.

The electrode wiring 163 is branched from the auxiliary electrode 162 and electrically connected to the auxiliary electrode 162. For example, the electrode wiring 163 extends in the second direction DR2 away from the auxiliary electrode 162 and then turn to the first direction DR1. In an example embodiment, the electrode wiring 163 and the auxiliary electrode 162 may be formed of the same conductive material.

Each of the pixels PX includes the second electrode 181 overlapping the first electrode 161. The second electrode 181 is isolated in each of the pixels PX so that two adjacent second electrodes of neighboring pixels of the pixels PX are physically separated from each other. The second electrode 181 overlaps the first electrode 161 and has an area larger than that of the first electrode 161. In an example embodiment, the first electrode 161 and the second electrode 181 may be concentric, and the second electrode 181 extends outward beyond the perimeter of the first electrode 161 in a plan view. In its portions protruding from the first electrode 161, the second electrode 181 overlaps the auxiliary electrode 162 to contact the auxiliary electrode 162 or to be electrically connected to the auxiliary electrode 162. More specifically, the protruding portions of the second electrode 181 extends beyond the perimeter of the bank layer 115 surrounding the first electrode 161 to contact or be electrically connected to the auxiliary electrode 162. Accordingly, neighboring pixels surrounded by the auxiliary electrode 162 may be electrically connected to the auxiliary electrode 162 via the second electrode 181.

The nine pixels whose second electrodes, as shown in FIG. 3, are electrically connected to each other by the auxiliary electrode 162 constitute a unit pixel group UPG The unit pixel group UPG includes the nine pixels. The present invention is not limited thereto. In an example embodiment, more than or less than nine pixels of the pixels PX may be electrically connected to each other, thereby forming one unit pixel group UPG In this case, the unit pixel group UPG may include more than or less than nine pixels. The second electrodes of the pixels included in the unit pixel group UPG are electrically connected by the auxiliary electrode 162 and are electrically isolated from second electrodes of neighboring unit pixel groups UPG The pixels belonging to the unit pixel group UPG are adjacent to each other. The unit pixel group UPG may include pixels arranged in a plurality of successive rows and a plurality of successive columns. The second electrodes belonging to the unit pixel group UPG may be all applied with the same voltage value. Second electrodes of different unit pixel groups may have different voltage values or may have the same voltage value in some cases. The unit pixel group UPG is connected to one electrode wring. The electrode wiring 163 may be connected to a power source for providing a common voltage and a touch sensor driver circuit.

The unit pixel group UPG may be repetitively arranged in a matrix, but embodiments are not limited to this case.

The first electrode 161 and the second electrode 181 of each of the pixels PX of the display panel 10 may be regularly and repetitively arranged regardless of the arrangement of the unit pixel groups. The unit pixel group UPG may be defined as a group of pixels of which second electrodes are commonly connected to the auxiliary electrode 162. That is, if a space between two adjacent bank layers is entirely filled with the auxiliary electrode 162 in the non-light emitting region NEM, a predetermined number (e.g., nine in FIG. 3) of second electrodes is electrically connected to the auxiliary electrode 162, thereby forming the unit pixel group UPG The auxiliary electrode 162 is disconnected and isolated in the non-light emitting region NEM from its neighboring auxiliary electrode for different unit pixel group. Therefore, the auxiliary electrode 162 of the unit pixel groups UPG is electrically isolated from its neighboring auxiliary electrodes.

Assuming that the distance between two adjacent first electrodes of adjacent pixels of the pixels PX is uniform, the auxiliary electrode 162 between the two first electrodes in the unit pixel group UPG may have a first width, and the auxiliary electrode 162 located on an outermost side of the unit pixel group UPG may have a second width smaller than the first width.

The second electrodes 181 may form a part of a touch electrode while each providing a common voltage to a corresponding pixel. That is, the second electrodes 181 may be commonly used for a common electrode and a touch electrode. Each unit pixel group UPG in which a plurality of second electrodes 181 are electrically connected may form one touch electrode.

A touch electrode is an electrode that senses whether a touch has been made by detecting a change in an electric field that occurs when an input object such as a part (e.g., a finger) of the body or a stylus touches a surface of the display device 1 (e.g., a surface of the window member 20). Methods of sensing a touch may include a self-capacitance method based on a change in capacitive coupling between one or more touch electrodes and an input object and a mutual capacitance method based on a change in capacitive coupling between two or more touch electrodes.

A touch electrode may be larger than a pixel in area and may have a size of, for example, 4 m×4 m. A plurality of pixels PX may be grouped into a unit pixel group UPG to form a touch electrode having the above area.

The unit pixel group UP forming the touch electrode may vary. This will be described in detail later.

Figure 5:
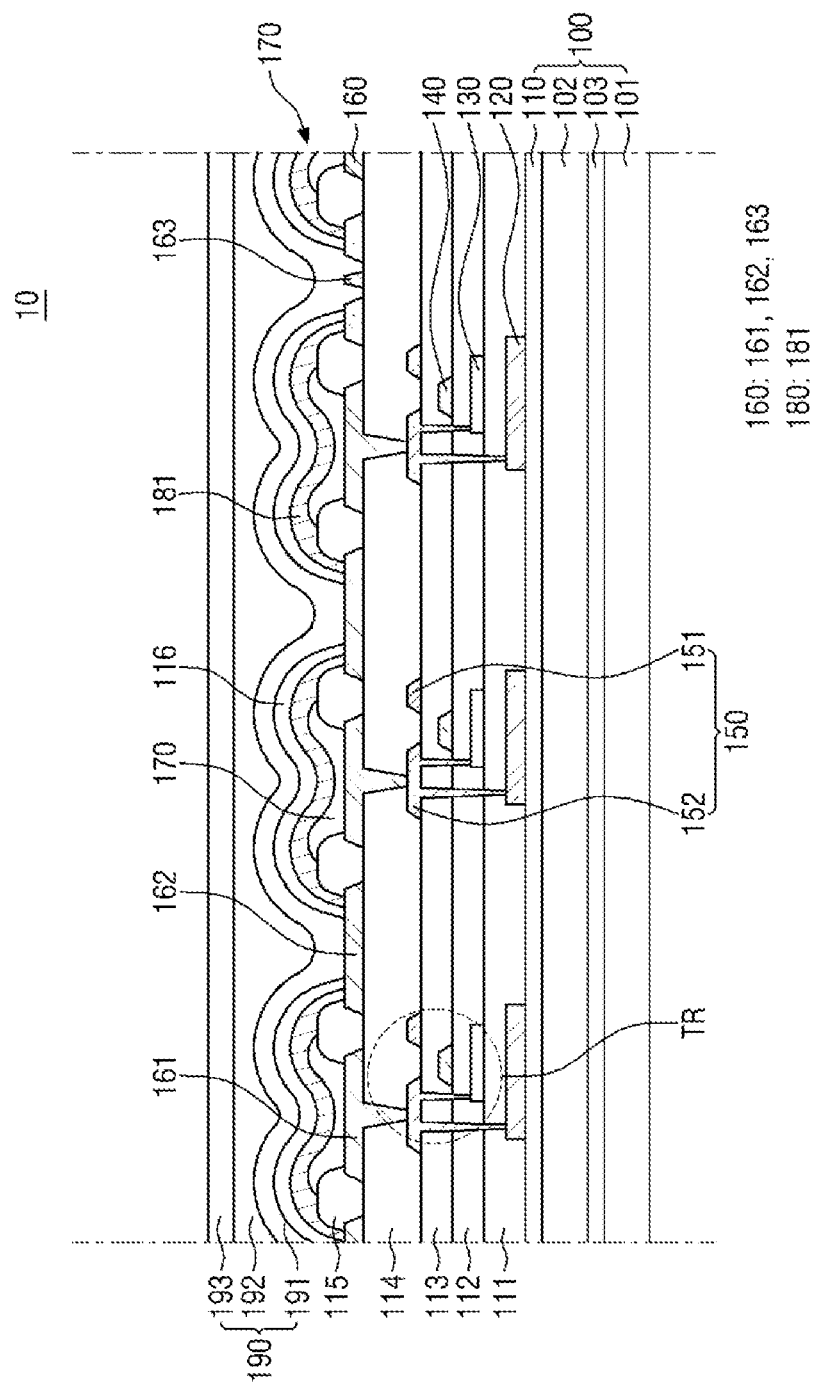
FIG. 5 is a cross-sectional view taken along line V-V' of FIG. 3.

FIG. 5 is a cross-sectional view taken along line V-V' of FIG. 3. The cross-sectional structure of each of the pixels PX of the display panel 10 described above will now be described with reference to FIGS. 3 through 5.

The display panel 10 includes the substrate 100. The substrate 100 supports each layer disposed on the substrate 100. The substrate 100 may be made of an insulating material such as polymer resin. The polymer resin may be, for example, polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination of these materials. In an example embodiment, the substrate 100 may be made of an inorganic material such as glass or quartz.

In an embodiment, the substrate 100 may include a plurality of sub-substrates. For example, the substrate 100 includes a first sub-substrate 101 and a second sub-substrate 102 stacked in the thickness direction. Each of the first sub-substrate 101 and the second sub-substrate 102 may be a flexible substrate made of, e.g., polyimide. The substrate 100 further includes a barrier layer 103 disposed between the first sub-substrate 101 and the second sub-substrate 102. The barrier layer 103 may include silicon nitride, silicon oxide, or silicon oxynitride. Although not shown, a barrier layer may also be disposed on the second sub-substrate 102.

A buffer layer 110 is disposed on the substrate 100. The buffer layer 110 may include silicon nitride, silicon oxide, or silicon oxynitride.

A light shielding metal layer 120 is disposed on the buffer layer 110. The light shielding metal layer 120 has a patterned shape and overlaps a semiconductor layer 130 disposed above the light shielding metal layer 120 (the first side of the third direction DR3) to prevent light coming from below from entering the semiconductor layer 130. The light shielding metal layer 120 may be electrically connected to a drain electrode 152 of each thin-film transistor TR. The light shielding metal layer 120 may be omitted. In this case, a first insulating layer 111 may also be omitted, and the semiconductor layer 130 may be disposed directly on the buffer layer 110.

The first insulating layer 111 is disposed on the light shielding metal layer 120. The first insulating layer 111 may be formed on the entire surface of the substrate 100. The first insulating layer 111 may insulate the semiconductor layer 130 and the light shielding metal layer 120 from each other. The first insulating layer 111 may include silicon nitride, silicon oxide, or silicon oxynitride.

The semiconductor layer 130 is disposed on the first insulating layer 111. As described above, the semiconductor layer 130 overlaps the light shielding metal layer 120 in the third direction DR3 which is the thickness direction. The semiconductor layer 130 may include a channel of the thin-film transistor TR of each of the pixels PX. The semiconductor layer 130 may include polycrystalline silicon. In an embodiment, the semiconductor layer 130 may include monocrystalline silicon, low-temperature polycrystalline silicon, amorphous silicon, or an oxide semiconductor. Examples of the oxide semiconductor may include a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc. In an embodiment, the semiconductor layer 130 may include ITZO (an oxide including indium, tin and titanium) or IGZO (an oxide including indium, gallium and tin).

A second insulating layer 112 is disposed on the semiconductor layer 130. The second insulating layer 112 may be a gate insulating film having a gate insulating function. The second insulating layer 112 may include a silicon compound, a metal oxide, or the like. For example, the second insulating layer 112 may include silicon oxide, silicon nitride, silicon oxynitride, aluminum oxide, tantalum oxide, hafnium oxide, zirconium oxide, titanium oxide, etc. These materials may be used alone or in combination with each other. The second insulating layer 112 may be a single layer or a multilayer consisting of stacked layers of different materials.

A gate conductive layer 140 is disposed on the second insulating layer 112. The gate conductive layer 140 may include a gate electrode of each thin-film transistor TR, a scan line connected to the gate electrode, and a first electrode of a capacitor (not shown). The gate electrode at least partially overlaps the semiconductor layer 130.

The gate conductive layer 140 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

A third insulating layer 113 is disposed on the gate conductive layer 140. The third insulating layer 113 may be an interlayer insulating film. The third insulating layer 113 may include an inorganic insulating material such as silicon oxide, silicon nitride, silicon oxynitride, hafnium oxide, aluminum oxide, titanium oxide, tantalum oxide or zinc oxide.

A data conductive layer 150 is disposed on the third insulating layer 113. The data conductive layer 150 may include data lines 151, a source electrode, not shown, of each thin-film transistor TR, a drain electrode 152 of each thin-film transistor TR, and a power wiring (not shown). The source electrode of each thin-film transistor TR may be electrically connected to a source region of the semiconductor layer 130 through contact holes penetrating the third insulating layer 113 and the second insulating layer 112. The drain electrode 152 of each thin-film transistor TR is electrically connected to a drain region of the semiconductor layer 130 through contact holes penetrating the third insulating layer 113 and the second insulating layer 112. The drain electrode 152 of each thin-film transistor TR is also electrically connected to the light shielding metal layer 120 through a contact hole penetrating the third insulating layer 113, the second insulating layer 112 and the first insulating layer 111.

The data conductive layer 150 may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The data conductive layer 150 may be a single layer or a multilayer. For example, the data conductive layer 150 may have a stacked structure of Ti/Al/Ti, Mo/Al/Mo, Mo/AlGe/Mo, or Ti/Cu.

A fourth insulating layer 114 is disposed on the data conductive layer 150. The fourth insulating layer 114 covers the data conductive layer 150. The fourth insulating layer 114 may be a via layer having at least one via hole for connecting the data conductive layer 150 to a conductive layer formed thereon. The fourth insulating layer 114 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

Although not shown, each of the gate conductive layer 140 and the data conductive layer 150 may be formed in two or more layers with an insulating layer interposed between them. That is, the gate conductive layer 140 may include a first gate conductive layer, an interlayer insulating film and a second gate conductive layer stacked sequentially. In this case, the second gate conductive layer may be utilized as a second electrode of the capacitor. In addition, the data conductive layer 150 may include a first data conductive layer, an interlayer insulating film, and a second data conductive layer stacked sequentially. In this case, the second data conductive layer may be utilized as the power wiring, a connection electrode, or the like.

A first electrode layer 160 is disposed on the fourth insulating layer 114. The first electrode layer 160 may include the first electrode 161 of a light emitting element, the auxiliary electrode 162, and the electrode wiring 163. The light emitting element may include an intermediate layer 170 which is disposed between the first electrode 161 and the second electrode 181 facing each other and may emit light. Any one of the first electrode 161 and the second electrode 181 of the light emitting element may be an anode, and the other one may be a cathode. In the illustrated embodiment, a case where the first electrode 161 is an anode and the second electrode 181 is a cathode is described. However, the opposite case is applicable. The intermediate layer 170 may include a light emitting layer such as an organic light emitting layer, a quantum-dot light emitting layer or a nano-dot light emitting layer.

The first electrode 161 may serve as a pixel electrode disposed in each of the pixels PX. The first electrode 161 is electrically connected to a corresponding thin-film transistor TR through a contact hole penetrating the fourth insulating layer 114. The auxiliary electrode 162 and the electrode wiring 163 are spaced apart from the first electrode 161. Referring to FIG. 4, the first electrode 161, and the auxiliary electrode 162 and the electrode wiring 163 are located in the light emitting region EMR and in the non-light emitting region NEM respectively.

The first electrode 161, the auxiliary electrode 162 and the electrode wiring 163 may be formed at the same process step to have the same stacked relationship. In an example embodiment, the first electrode 161, the auxiliary electrode 162 and the electrode wiring 163 may be formed of the same material, may have substantially the same thickness or may be positioned at substantially the same height from the substrate 100. The first electrode layer 160 may have, but not limited to, a stacked structure in which a material layer having a high work function such as indium tin oxide (ITO), indium zinc oxide (IZO), zinc oxide (ZnO) or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof are stacked. The material layer having a high work function may be disposed on the reflective material layer. The material layer may be closer to the intermediate layer 170 than the reflective material layer. The first electrode layer 160 may have a multilayer structure of, but not limited to, ITO/Mg, ITO/MgF, ITO/Ag, or ITO/Ag/ITO.

The bank layer 115 is disposed on the first electrode layer 160. The bank layer 115 may be disposed around the first electrode 161 to form a closed loop. A portion of the bank layer 115 overlaps the first electrode 161, and the other portion of the bank layer 115 may not overlap the first electrode 161. In addition, the bank layer 115 partially overlaps the auxiliary electrode 162. The bank layer 115 may include an opening exposing the first electrode 161. A region of the first electrode 161 exposed by the bank layer 115 is the light emitting region EMR. The bank layer 115 around the first electrode 161 is spaced apart from another bank layer around another neighboring first electrode.

The bank layer 115 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB). In an example embodiment, the bank layer 115 may include an inorganic material. In an example embodiment, the bank layer 115 may include a stacked layer of an inorganic layer and an organic layer.

The intermediate layer 170 is disposed in the opening of the bank layer 115. The intermediate layer 170 may include an organic light emitting layer and may further include a hole injection/transport layer and/or an electron injection/transport layer. The intermediate layer 170 may contact an upper surface of the first electrode 161 exposed through the opening of the bank layer 115 and extend onto a surface of the bank layer 115. The intermediate layer 170 may be larger in size than the first electrode 161 in a plan view. The intermediate layer 170 may not be disposed on the auxiliary electrode 162 or the electrode wiring 163.

A second electrode layer 180 may be disposed on the intermediate layer 170. The second electrode layer 180 may include the second electrode 181 of the light emitting element. The second electrode 181 may have the same or similar planar shape to the intermediate layer 170 but may be larger than the intermediate layer 170 in a plan view. The second electrode 181 covers the intermediate layer 170 and the bank layer 115 and extend onto the auxiliary electrode 162 outside the bank layer 115. The second electrode 181 does not physically contact the first electrode 161 because the intermediate layer 170 and the bank layer 115 are interposed between the second electrode 181 and the first electrode 161 but directly contacts an upper surface of the auxiliary electrode 162. The second electrode 181 of each of the pixels PX belonging to the unit pixel group UPG is physically separated from its adjacent second electrodes of neighboring pixels in the unit pixel group UPG but is electrically connected to the adjacent second electrodes of the neighboring pixels by the auxiliary electrode 162. For example, the second electrodes of a unit pixel group may be separated from each other but may be electrically connected to each other through an auxiliary electrode corresponding to a unit pixel group. Although not shown in the drawings, the second electrode layer 180 may further include other electrodes or signal wirings in addition to the second electrodes 181. The second electrode layer 180 may not be disposed on the auxiliary electrode 162 or the electrode wiring 163.

The second electrode layer 180 may include a material layer having a small work function, such as Li, Ca, LiF/Ca, LiF/Al, Al, Mg, Ag, Pt, Pd, Ni, Au, Nd, Ir, Cr, BaF, Ba, or a compound or mixture thereof (e.g., a mixture of Ag and Mg). In an example embodiment, the second electrode layer 180 may include a transparent metal oxide layer disposed on the material layer having a small work function.

A passivation layer 116 is disposed on the second electrode layer 180. The passivation layer 116 may have the same or similar planar shape to the second electrode 181 but may be larger than the second electrode 181. The passivation layer 116 covers the second electrode 181 and extends onto the auxiliary electrode 162 outside the second electrode 181. For example, the passivation layer 116 covering the second electrode 181 extends onto a portion of the auxiliary electrode 162 that is not covered by the second electrode 181. The passivation layer 116 contacts the upper surface of the auxiliary electrode 162. The passivation layer 116 overlaps and completely covers the first electrode 161, the intermediate layer 170 and the second electrode 181 disposed under the passivation layer 116. The passivation layer 116 partially exposes the auxiliary electrode 162 without completely covering the auxiliary electrode 162. The passivation layer 116 may not be disposed on the electrode wiring 163. The passivation layer 116 of each of the pixels PX is physically separated from passivation layers of neighboring pixels.

The passivation layer 116 may silicon nitride, silicon oxide, or silicon oxynitride. In some cases, the passivation layer 116 may be omitted.

The intermediate layer 170, the second electrode layer 180 and the passivation layer 116 may be formed using the same pattern mask. This will be described in detail later.

The thin-film encapsulation layer 190 is disposed on the passivation layer 116. The thin-film encapsulation layer 190 may be disposed on the entire surface of the substrate 100. The thin-film encapsulation layer 190 may contact the upper surface of the auxiliary electrode 162 exposed by the passivation layer 116, but embodiments are not limited to this case. The thin-film encapsulation layer 190 includes a first inorganic layer 191, a first organic layer 192, and a second inorganic layer 193. Each of the first inorganic layer 191 and the second inorganic layer 193 may include silicon nitride, silicon oxide, or silicon oxynitride. The first organic layer 192 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

An exemplary method of manufacturing the display panel 10 described above will now be described with reference to FIGS. 6 through 12. FIGS. 6 through 12 are cross-sectional views illustrating operations of a method of manufacturing a display panel according to an embodiment.

Figure 6:
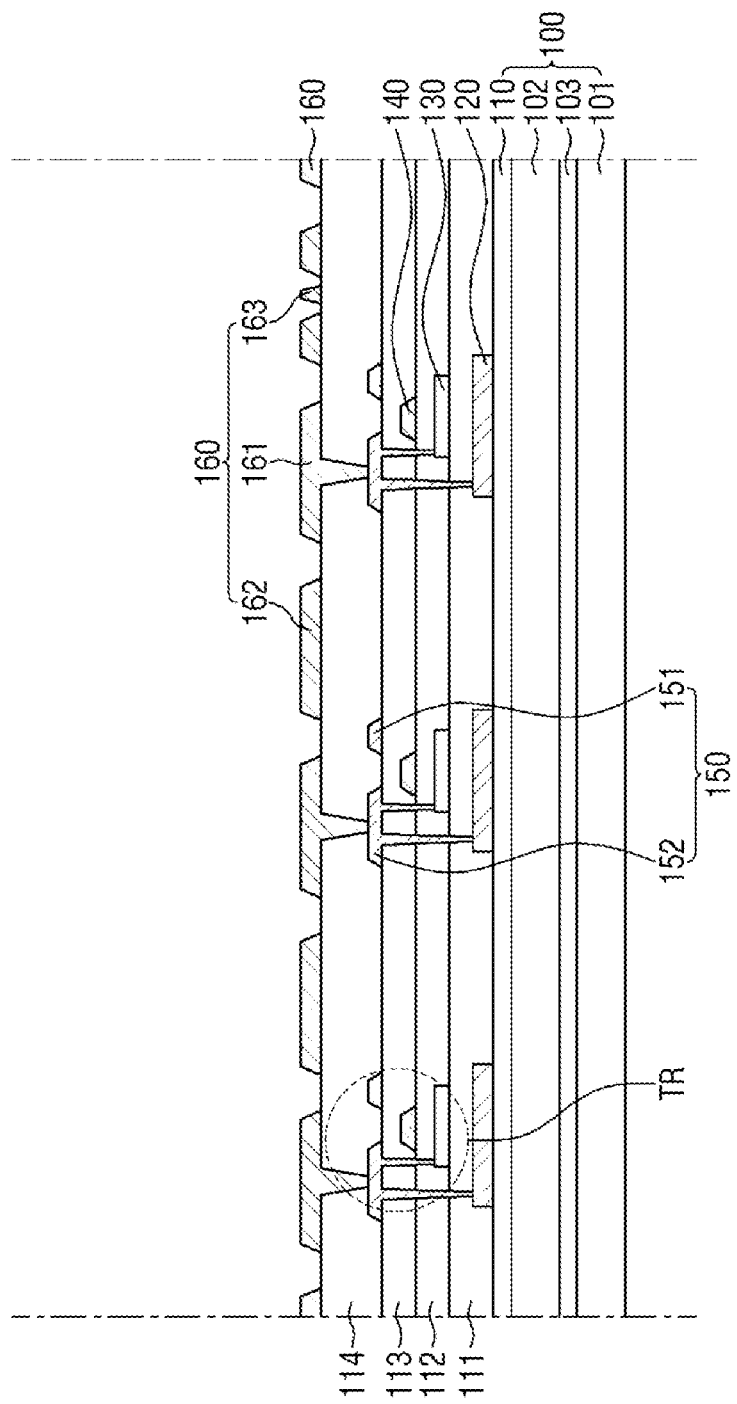
FIGS. 6 through 12 are cross-sectional views illustrating operations of a method of manufacturing a display panel according to an embodiment.

Referring to FIG. 6, a substrate 100 having a thin-film transistor TR and a fourth insulating layer 114 covering the thin-film transistor TR and having a contact hole exposing a second electrode of the thin-film transistor TR is prepared. Various methods of manufacturing the substrate 100 having the above structure are known in the art, and thus a detailed description thereof is omitted.

Next, a first electrode layer 160 including a first electrode 161, an auxiliary electrode 162 and an electrode wiring 163 is formed on the fourth insulating layer 114. The first electrode layer 160 may be formed, for example, by stacking a first electrode material on the fourth insulating layer 114 using a method such as deposition and patterning the first electrode material using a method such as photolithography.

Figure 7:
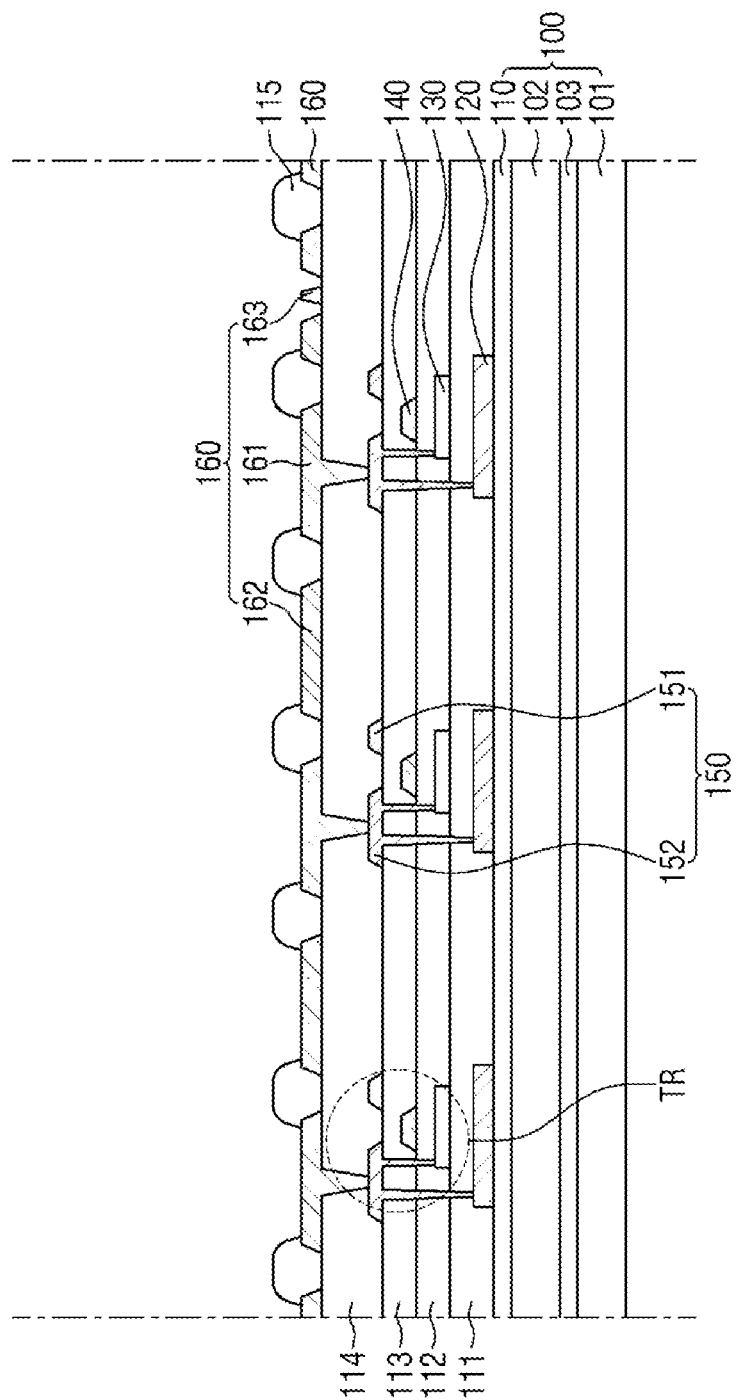

Referring to FIG. 7, a bank layer 115 is formed to partially overlap the first electrode 161 and the auxiliary electrode 162 and to include an opening exposing the first electrode 161. Patterns of the bank layer 115 may be formed by a photolithography process. For example, when the bank layer 115 is made of an organic material including a photosensitive material, the patterns may be formed by coating the organic material and then performing an exposure and development process.

Figure 8:
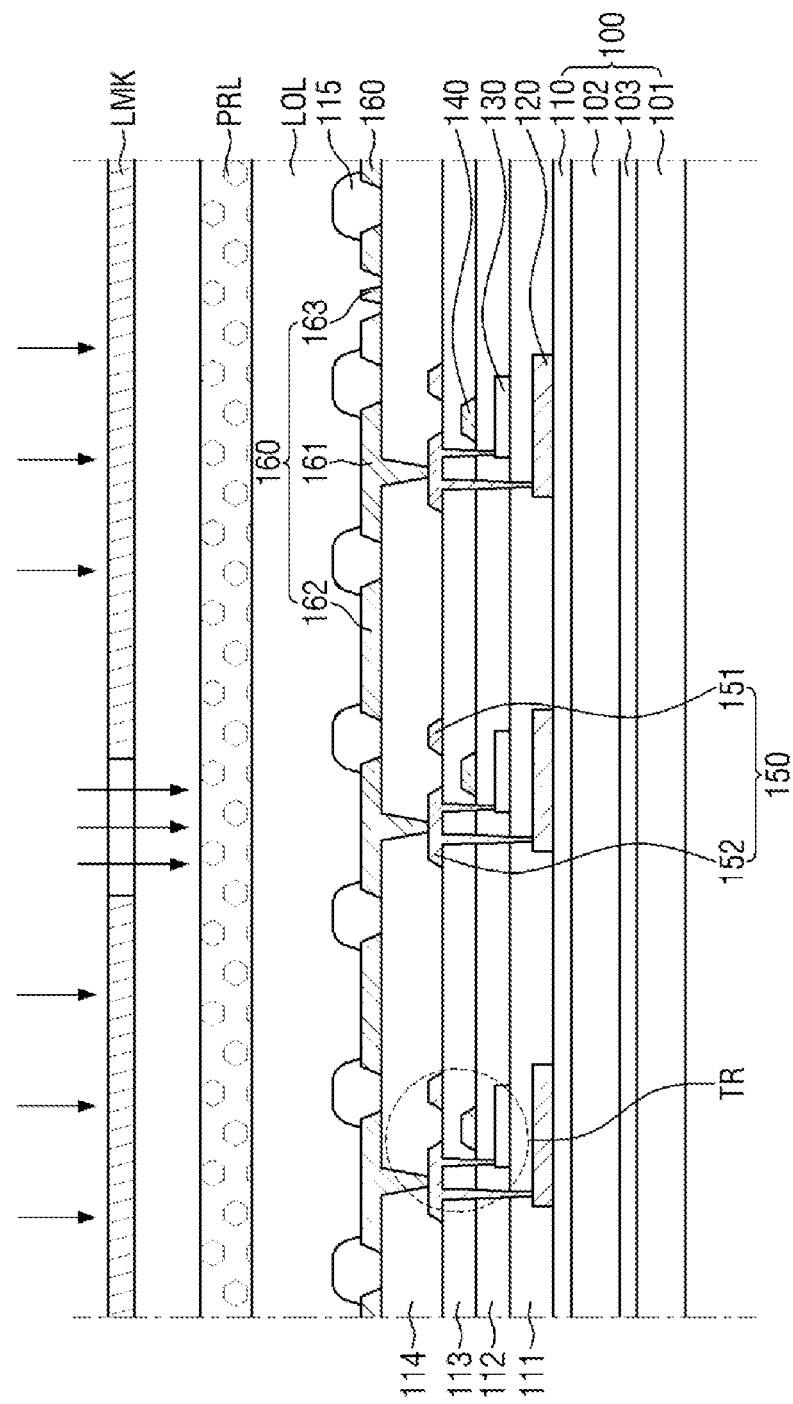
Figure 9:
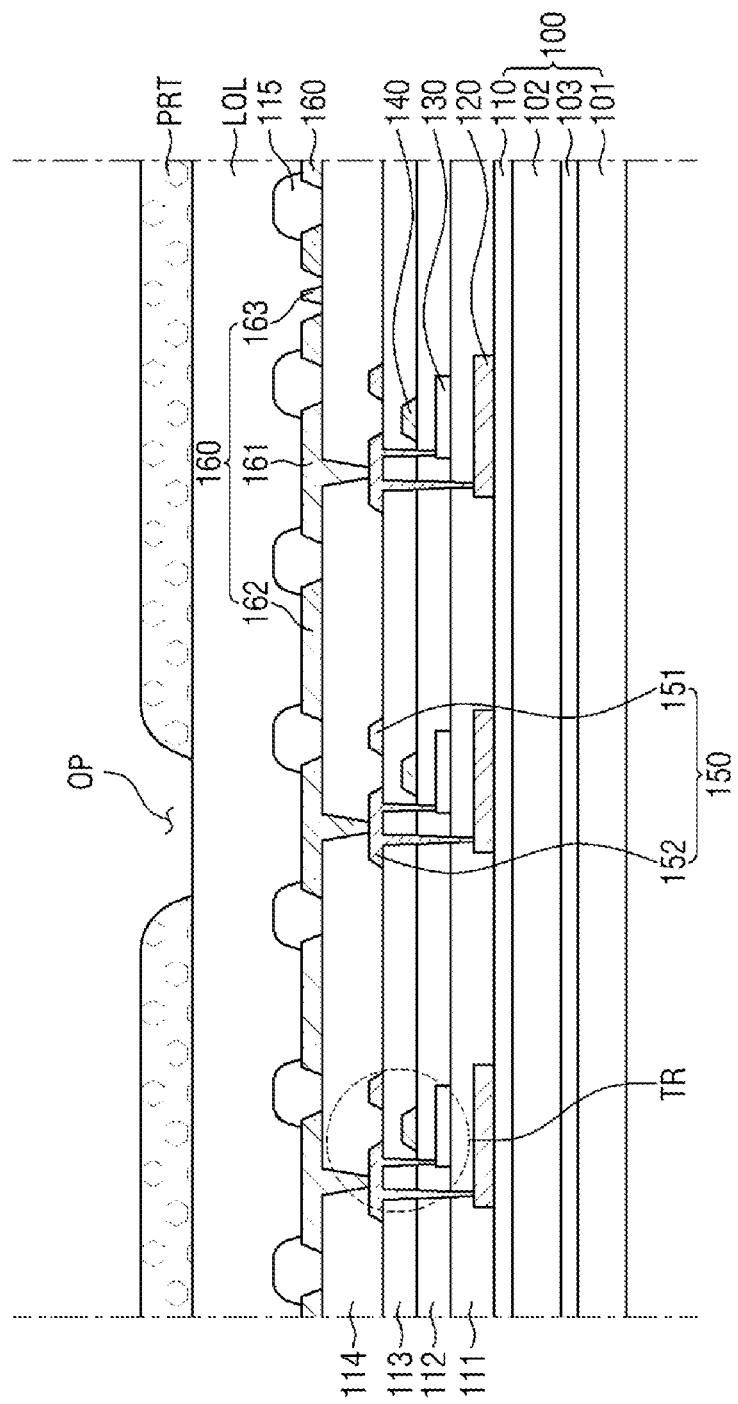

Referring to FIGS. 8 and 9, a lift-off layer LOL is formed on the first electrode layer 160 and the bank layer 115. The lift-off layer LOL may be stacked on the entire surface of a target structure.

The lift-off layer LOL may include a non-photosensitive organic material. In addition, the lift-off layer LOL may include a fluoropolymer. The fluoropolymer may include a polymer having a fluorine content of 20 to 60 wt %. Examples of the fluoropolymer contained in the lift-off layer LOL may include, but are not limited to, polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, or a copolymer of chlorotrifluoroethylene and perfluoroalkylvinylether. The lift-off layer LOL may be formed using a method such as a coating method, a printing method, or a deposition method.

Next, a mask layer PRL is formed on the lift-off layer LOL. The mask layer PRL may include a photoresist. Although a case where a positive photoresist is applied is shown in the drawings, a negative photoresist is also applicable.

Next, the mask layer PRL is exposed using a photomask LMK and then developed to form a mask pattern PRT exposing a portion of the lift-off layer LOL as shown in FIG. 9. An opening OP of the mask pattern PRT overlaps the first electrode 161 of a specific color pixel and further overlaps a portion of the bank layer 115 around the first electrode 161. The opening OP of the mask pattern PRT may not overlap the auxiliary electrode 162 adjacent to the first electrode 161. In the current operation, regions of the lift-off layer LOL in other color pixels may all be covered by the mask pattern PRT.

Figure 10:
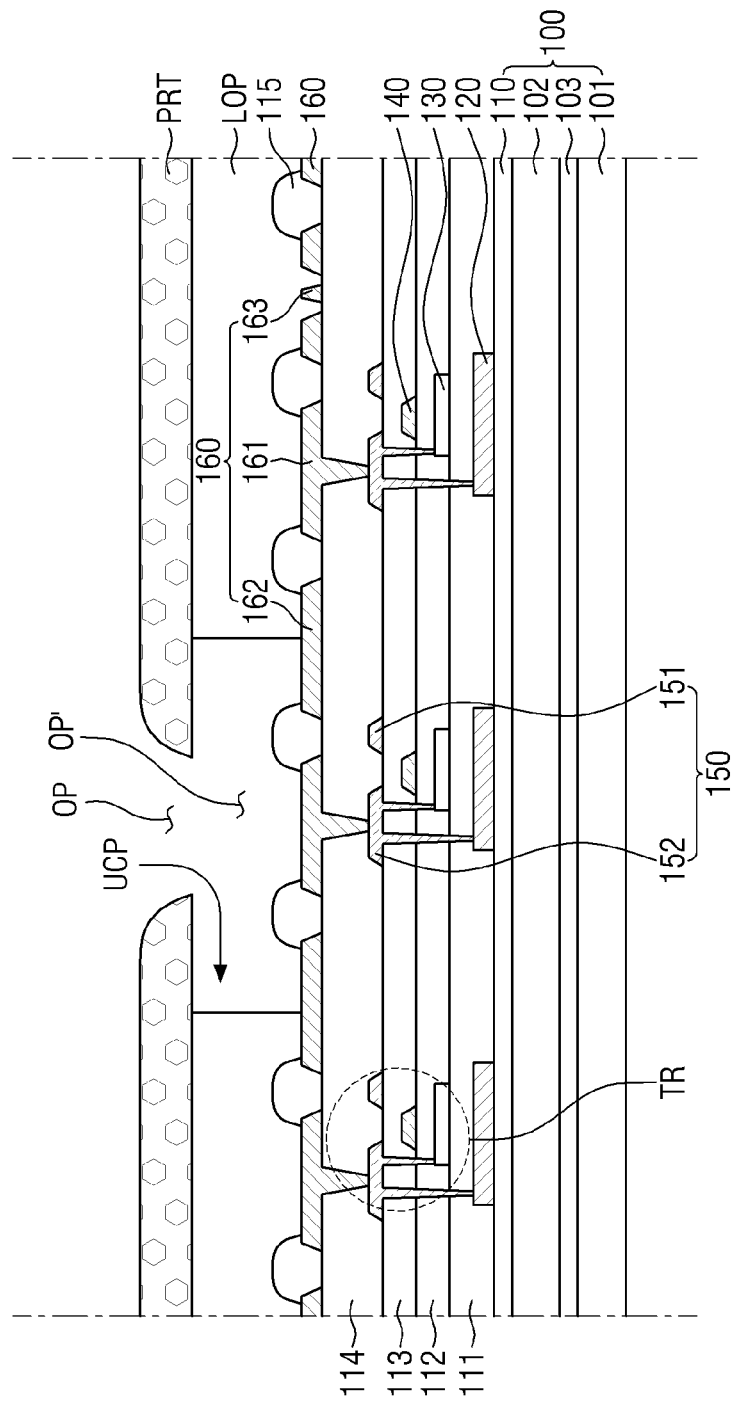

Referring to FIG. 10, the lift-off layer LOL is etched using the mask pattern PRT as an etch mask to form a lift-off pattern LOP. The lift-off layer LOL may be etched by isotropic etching such as wet etching or dry etching. When the lift-off layer LOL includes a fluoropolymer, it may be etched using a solvent containing hydrofluoroether (as a solvent containing fluorine) as an etchant.

As a result of the isotropic etching, an undercut profile UCP may be formed under the opening OP of the mask pattern PRT. Accordingly, the structure under the opening OP of the mask pattern PRT may be exposed by a width (i.e., a width of an opening OP' of the lift-off pattern LOP) greater than the opening OP of the mask pattern PRT. That is, the first electrode 161 and a portion of the bank layer 115 around the first electrode 161 are exposed by the opening OP' of the lift-off pattern LOP.

Figure 11:
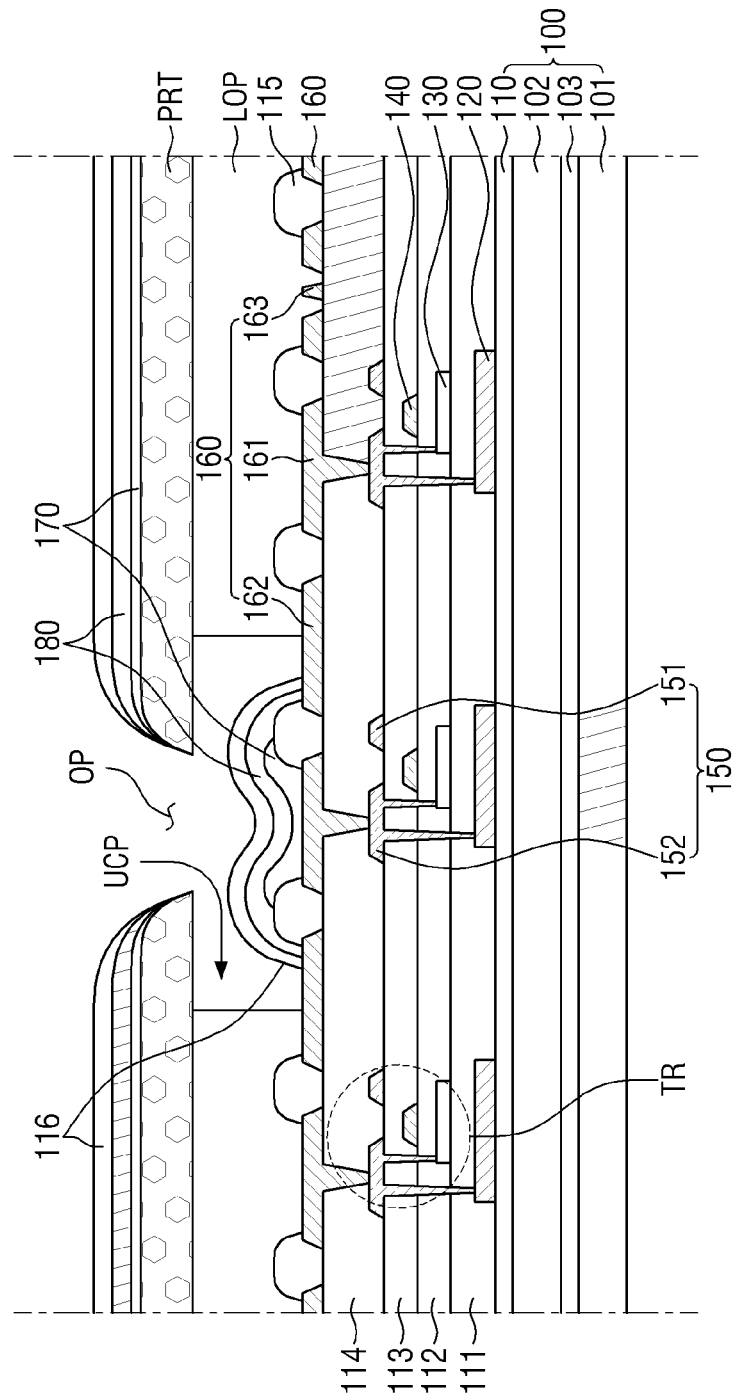

Referring to FIG. 11, an intermediate layer 170, a second electrode layer 180 and a passivation layer 116 may be sequentially deposited on the resultant structure of FIG. 10. The intermediate layer 170, the second electrode layer 180 and the passivation layer 116 may be deposited by vacuum deposition such as evaporation or sputtering which is non-conformal deposition. Each of the intermediate layer 170, the second electrode layer 180 and the passivation layer 116 may be entirely deposited without using a fine metal mask (FMM).

Even if a material layer is entirely deposited, the deposited material layer may be patterned on a target substrate using the mask pattern PRT without using a photolithography process. In an example embodiment, a deposition material may be deposited on the first electrode 161 and the bank layer 115 through the opening OP of the mask pattern PRT and may also be deposited on upper and side surfaces of the mask pattern PRT. Because the deposition is non-conformal deposition, the deposition material is not deposited on a bottom surface of the mask pattern PRT and the sidewall of the lift-off pattern LOP which are blocked by the mask pattern PRT from a material source of the vacuum deposition. The shape of the deposition material deposited on the first electrode 161 and the bank layer 115 through the opening OP of the mask pattern PRT may be substantially the same or similar to the opening OP of the mask pattern PRT. However, the size of the deposition material may be adjusted to be different from the size of the opening OP of the mask pattern PRT according to process conditions.

Specifically, when the deposition material advances toward the second side of the third direction DR3 (that is, in a direction substantially perpendicular to a deposition target) and has a high directionality, it may be deposited on a target substrate only in a region overlapping the opening OP of the mask pattern PRT. Therefore, a deposited pattern may have a size similar to that of the opening OP of the mask pattern PRT. However, when the directionality of the deposition material is reduced or the advancing angle (or incident angle) of the deposition material is changed by changing the process conditions, the deposition material may be deposited not only in the region overlapping the opening OP but also in a region inside the above region and overlapping the mask pattern PRT if that region is exposed. As a result, a deposited pattern may have a size larger than that of the opening OP of the mask pattern PRT. In this embodiment, the thickness of the deposited pattern in the region overlapping the mask pattern PRT may be smaller than the thickness of the deposited pattern in the region overlapping the opening OP of the mask pattern PRT. Therefore, the intermediate layer 170, the second electrode layer 180 and the passivation layer 116 deposited using the above method may be relatively thick in their central portions overlapping the first electrode 161 and may become thinner toward outer ends thereof.

In the illustrated embodiment, the size of the deposited pattern may increase in the listed order of the intermediate layer 170, the second electrode layer 180 and the passivation layer 116. Here, the illustrated pattern shape may be formed by using the same mask pattern PRT but by changing the process conditions as described above. That is, the intermediate layer 170 may be deposited to cover the first electrode 161 and a portion of the bank layer 115, and the second electrode layer 180 may be deposited to be larger than the intermediate layer 170 in a plan view, to cover the whole of the intermediate layer 170 and to extend outward from the intermediate layer 170 to cover the bank layer 115 and contact a portion of the auxiliary electrode 162. In addition, the passivation layer 116 may be deposited to be larger than the second electrode layer 180 in a plan view, to cover the whole of the second electrode layer 180 and to extend outward from the second electrode layer 180 to contact a portion of the auxiliary electrode 162.

Figure 12:
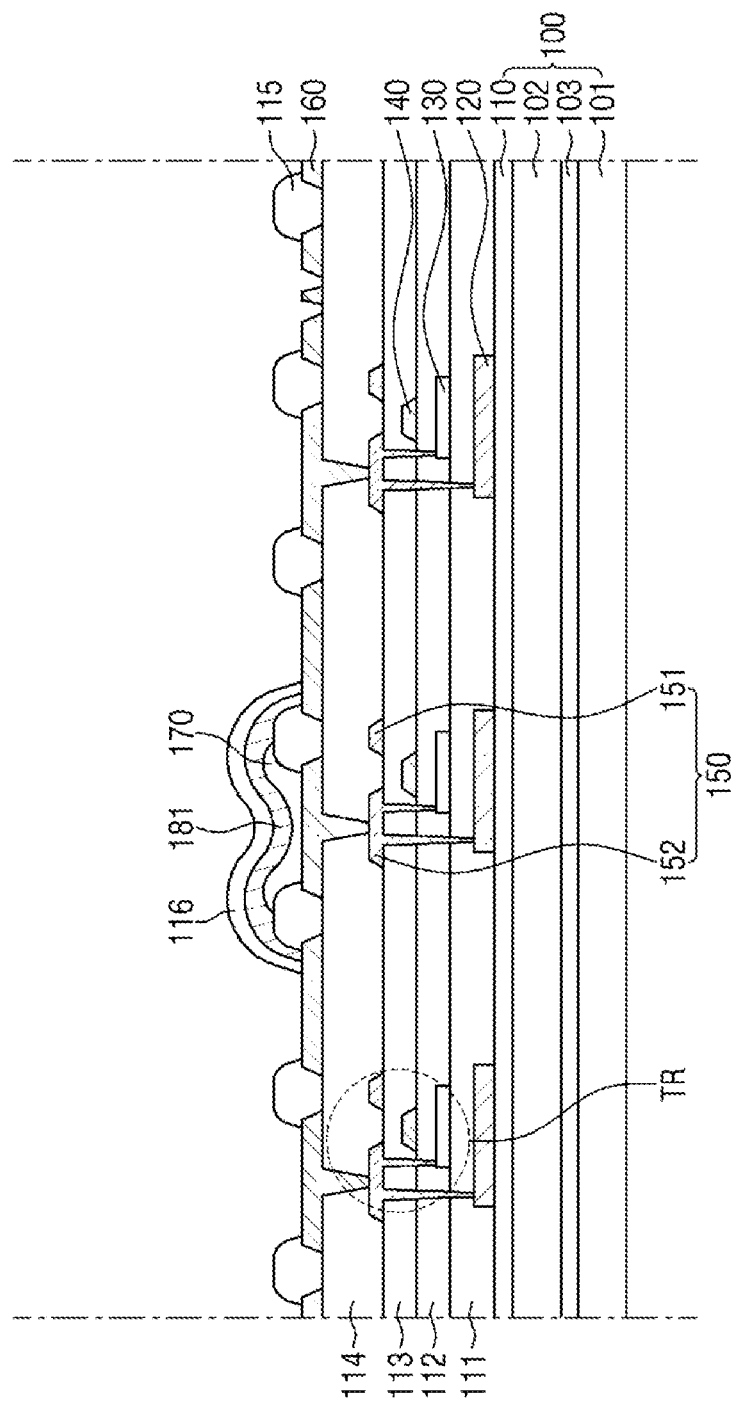

Referring to FIG. 12, a lift-off process is performed. For example, the lift-off pattern LOP may be removed with the deposition materials including the intermediate layer 170, the second electrode layer 180 and the passivation layer 116 disposed on the lift-off pattern LOP. The lift-off process may be performed using the same solution as the solution used to etch the lift-off layer LOL. For example, the lift-off layer LOL may be removed using a solution that contains a solvent containing hydrofluoroether as a solvent containing fluorine. The solution may pass through the opening OP of the mask pattern PRT to contact an etched surface of the lift-off pattern LOP and then sequentially etch into the lift-off pattern LOP from the etched surface, thereby removing the lift-off pattern LOP.

Since the intermediate layer 170 and/or the second electrode 181 formed on the substrate 100 is covered by the passivation layer 116, they may be protected without being exposed to the solution in the lift-off process.

Next, the operations of FIGS. 8 through 12 may be repeatedly performed on other color pixels, and then a thin-film encapsulation layer 190 is formed on the resultant structure obtained from the repeated operations of FIGS. 8 through 12, thereby completing the display panel 10 as shown in FIG. 5.

In the current embodiment, a unit process consisting of the forming of the mask pattern PRT, the depositing of a material, and a lift-off process may be separately performed on each of different color pixels. Therefore, a total of three unit processes may be performed. However, when the intermediate layer 170 of each of the color pixels includes the same light emitting material, only one unit process may be performed to form patterns having the above structure. That is, in the above case, the mask pattern PRT may be formed to include openings OP overlapping the first electrodes 161 of all of the pixels PX, and then the intermediate layer 170, the second electrode layer 180 and the passivation layer 116 may be formed simultaneously in all of the pixels PX after the lift-off layer LOL is etched.

In the method illustrated in FIGS. 6 through 12, the intermediate layer 170 including a light emitting layer is formed using a lift-off process instead of a deposition process using an FMM. Therefore, the misalignment problem of the FMM may be prevented with the reduction of manufacturing costs. In addition, since the auxiliary electrode 162 is formed in the same process as the first electrodes 161, the auxiliary electrode 162 may be formed without using an additional photomask process, and the first electrode 161 may be prevented from being damaged, which may occur if the auxiliary electrode 162 is separately patterned.

In the light emitting element of the display panel 10, the first electrode 161 provided in each of the pixels PX may receive a voltage corresponding to corresponding data through the thin-film transistor TR, and the second electrode 181 may receive a common voltage through the electrode wiring 163 and the auxiliary electrode 162. The light emitting element may emit light when an electric current corresponding to the above voltages flows through the intermediate layer 170 from the first electrode 161 to the second electrode 181. In addition, the second electrode 181 of the light emitting element may recognize whether a touch has been made by sensing an electric field that changes according to a touch input. In order for the second electrode 181 to serve as a common electrode and a touch electrode, the second electrode 181 may be connected alternately to one of a power source generating the common voltage and the touch sensor driver circuit. For example, the second electrode 181 may receive alternately one of a common voltage ELVSS (see FIGS. 13 and 14) and a touch signal TS (see FIG. 14). This will be now described in detail with reference to FIGS. 13 and 14.

Figure 13:
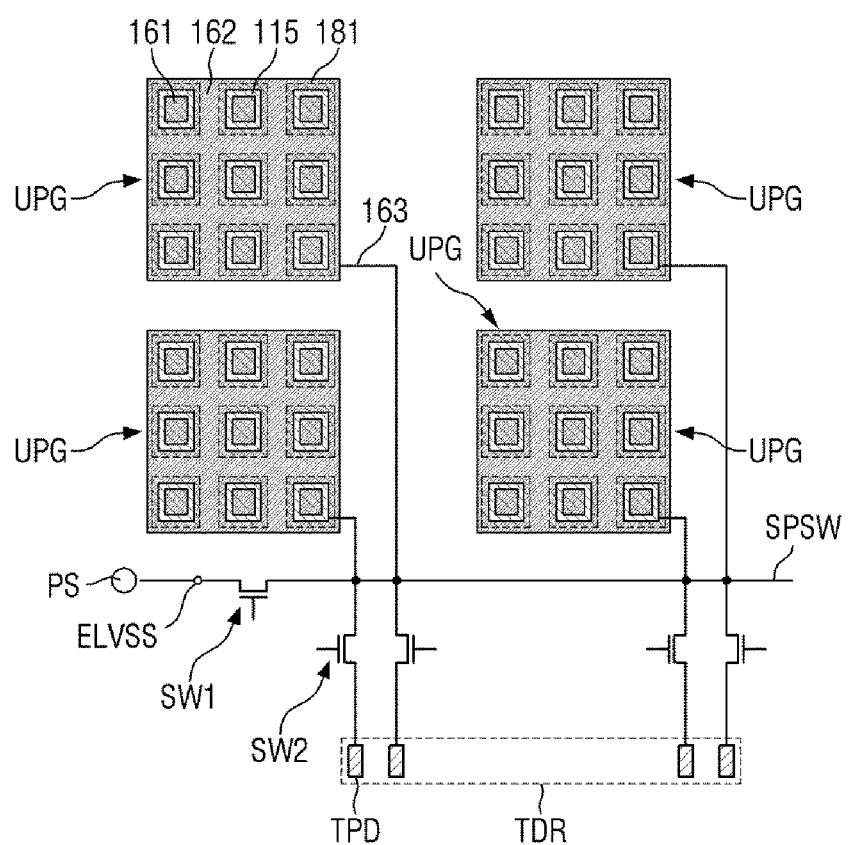
FIG. 13 is a diagram showing the driving connection relationship between unit pixel groups of the display panel according to the embodiment.
Figure 14:
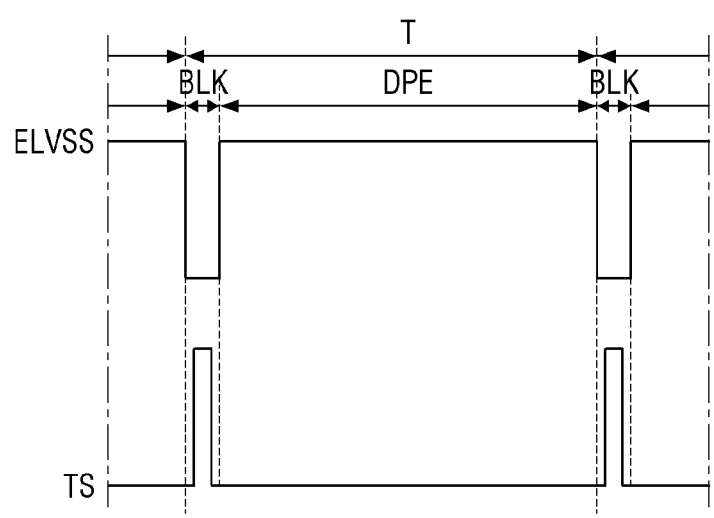
FIG. 14 is a graph showing a driving waveform of the display panel according to the embodiment.

FIG. 13 is a diagram showing the driving connection relationship between the unit pixel groups UPG of the display panel 10 according to the embodiment. FIG. 14 is a graph showing a driving waveform of the display panel 10 according to the embodiment.

Referring to FIGS. 13 and 14, a unit pixel group UPG includes an electrode wiring 163 connected to a second power supply wiring SPSW. Each of electrode wirings 163 of unit pixel groups may be connected commonly to the second power supply wiring SPSW. The second power supply wiring SPSW may be connected to a power source PS providing the common voltage ELVSS via a first switch SW1. When the first switch SW1 is turned on, the common voltage ELVSS may be provided to the second electrode 181 and the auxiliary electrode 162 of the unit pixel group UPG connected to the second power supply wiring SPSW via the first switch SW1.

The electrode wiring 163 is also connected to a touch driving pad TPD via a second switch SW2. The touch driving pad TPD connected to the unit pixel group UPG may be separated from the other touch driving pads and may be individually connected to a touch sensor driver circuit TDR. In an example embodiment, the touch sensor driver circuit TDR may include a time domain reflectometry. When the second switch SW connected to the electrode wiring 163 is turned on, the touch sensor driver circuit TDR may transmit a touch driving signal to a corresponding unit pixel group UPG or a signal sensed by the second electrodes 181 of the corresponding unit pixel group UPG may be transmitted to the touch sensor driver circuit TDR. The second switches SW2 connected to the electrode wiring 163 may all be turned on simultaneously or turned off simultaneously.

For the convenience of a description, it is assumed that the unit pixel group UPG includes nine second electrodes commonly connected to the auxiliary electrode 162. In this case, the second electrodes and the auxiliary electrode 162 of the unit pixel group UPG may receive the common voltage ELVSS to function as a common electrode of light emitting elements or may receive a touch driving voltage or provide a sensed voltage or capacitance to the touch sensor driver circuit TDR to function as a touch electrode. If the common voltage ELVSS is applied in a mode of recognizing a touch input, it is almost impossible to sense a touch input. Therefore, the first switch SW1 needs to be turned off in the mode of recognizing a touch input. In this regard, the first switch SW1 and the second switches SW2 may not be turned on simultaneously. In an example embodiment, the first switch SW1 and the second switch SW2 may be alternately controlled.

A driving period T of a display screen may include a display period DPE and an idle period BLK as shown in FIG. 14. The display period DPE and the idle period BLK may be alternately repeated. The display period DPE may be an emission period during which light is emitted to display a screen. The idle period BLK may be a non-emission period which is located between the display periods DPE and during which light is not emitted. The idle period BLK may be a blank period or a porch period. In an example embodiment, the driving period T may correspond to a horizontal period or a frame period. In this case, the idle period BLK may be provided in a horizontal period or a frame period, but embodiments are not limited to this case.

In the display period DPE, the first switch SW1 may be turned on so that the common voltage ELVSS is provided to the second electrodes 181 and the auxiliary electrode 162 of the unit pixel group UPG through the electrode wiring 163. At this time, the second switch SW2 may be turned off.

In the idle period BLK, the first switch SW1 is turned off. A turn-on period of the second switches SW2 is included in the idle period BLK. Whether a touch input has been made may be detected by transmitting the touch signal TS to the unit pixel group UPG for a period of time during which the second switch SW2 is turned on and analyzing a signal sensed by the unit pixel group UPG FIG. 15 is a schematic view showing the arrangement of the unit pixel group UPG according to embodiments.

The unit pixel group UPG may serve as a touch electrode, and the touch electrode arrangement applicable to a 1-layer touch panel may be variously implemented according to a shape in which the unit pixel group UPG is repeatedly arranged. One example is shown in FIG. 15. In FIG. 15, the arrangement of the pixels PX in the unit pixel group UPG and the arrangement of second electrodes and the auxiliary electrode 162 in the unit pixel group UPG are not shown for ease of description.

Figure 15:
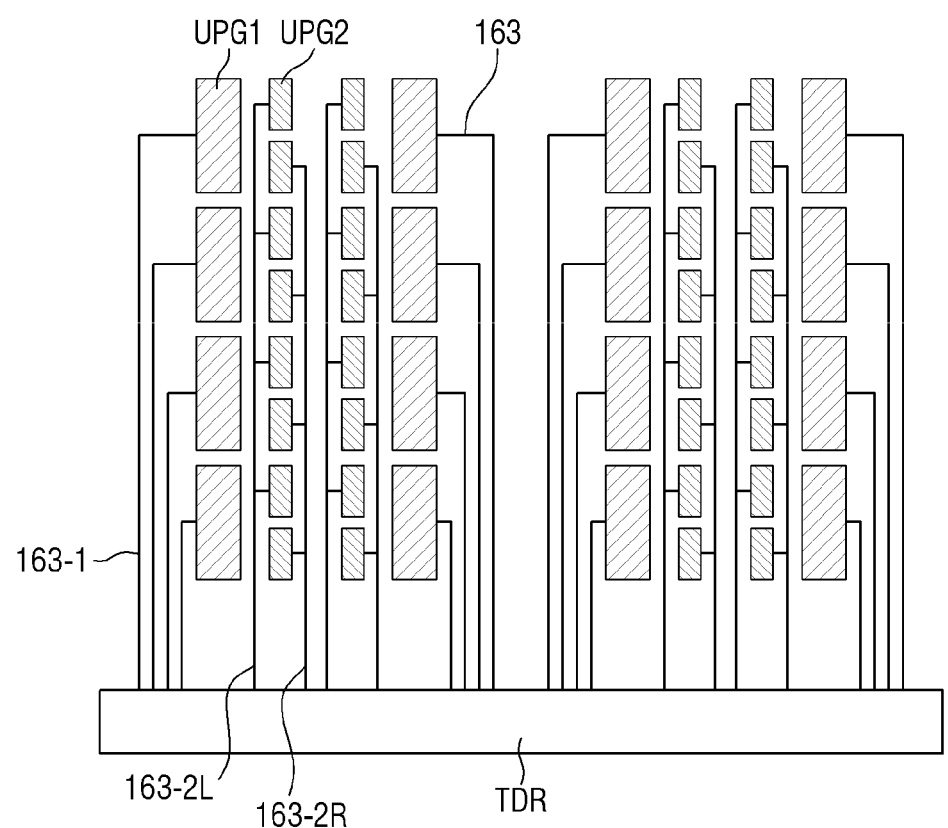
FIG. 15 is a schematic view showing the arrangement of unit pixel groups according to embodiments.

Referring to FIG. 15, a plurality of unit pixel groups are arranged in a matrix form. The unit pixel group UPG may be divided into a first unit pixel group UPG1 and a second unit pixel group UPG2. The first unit pixel group UPG1 is wider than the second unit pixel group UPG2 in the vertical direction. One row of first unit pixel group along a row direction may correspond to a plurality of rows (e.g., two rows) of second unit pixel groups in the row direction.

The matrix form in the arrangement of the unit pixel groups may include columns in which the first unit pixel groups are arranged and columns in which second unit pixel groups UPG2 are arranged. In the illustrated example, first, fourth, fifth and eighth columns are columns in which the first unit pixel groups are arranged, and second, third, sixth and seventh columns are columns in which second unit pixel groups are arranged.

Each of the first unit pixel groups may be connected to a first electrode wiring 163-1. The second unit pixel groups (e.g., two or more second unit pixel groups) may share a second electrode wiring 163-2. In an example embodiment, the second unit pixel groups in odd-numbered rows (first, third, fifth and seventh rows) may share a left-second electrode wiring 163-2L, and the second unit pixel groups in even-numbered rows (second, fourth, sixth and eighth rows) may share a right-second electrode wiring 163-2R.

In the arrangement of FIG. 15, whether a touch has been made may be sensed using a mutual capacitance method. In this case, each of the first unit pixel groups may be used as a touch driving electrode (or a TX electrode), and each of the second unit pixel groups may be used as a touch sensing electrode (or an RX electrode). However, embodiments are not limited to this case.

Figure 16:
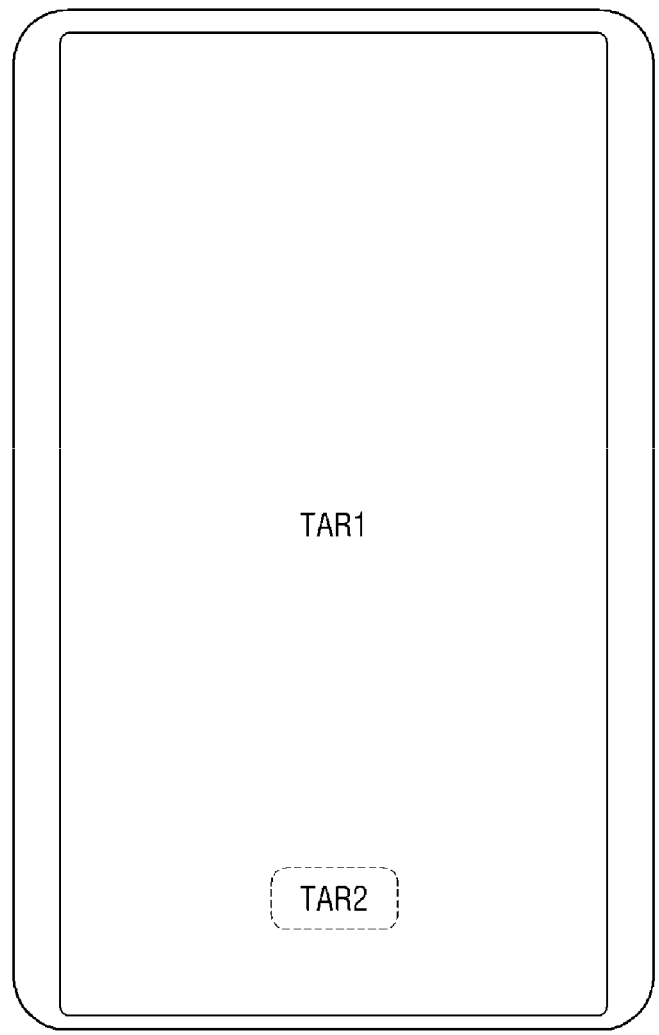
FIG. 16 is a schematic plan view of the display panel according to the embodiment.
Figure 17:
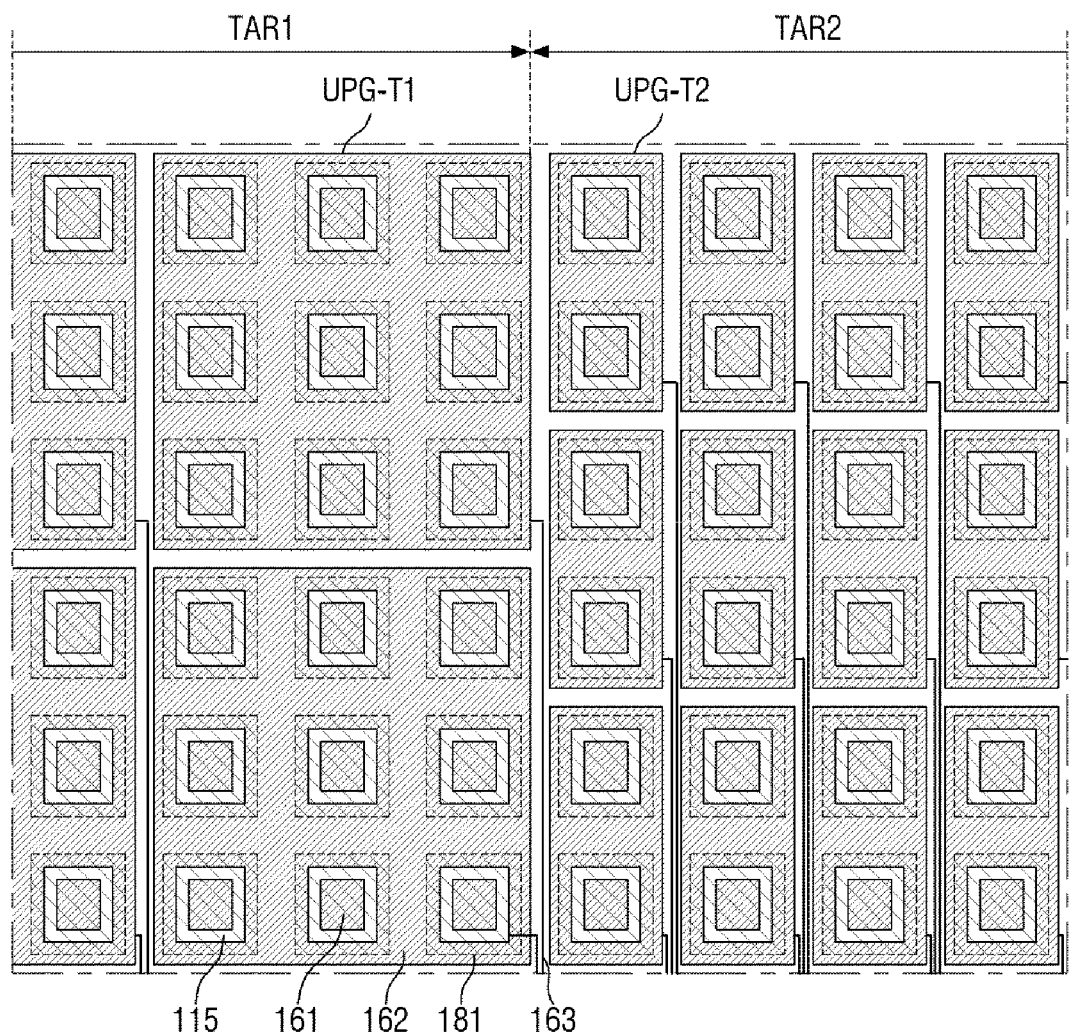
FIG. 17 is a layout view comparing unit pixel groups of a first touch region and a second touch region.

The above arrangement of touch electrodes may be changed according to the use of a touch region. FIG. 16 is a schematic plan view of the display panel 10 according to the embodiment. FIG. 17 is a layout view comparing unit pixel groups of a first touch region TAR1 and a second touch region TAR2.

Referring to FIGS. 16 and 17, the display panel 10 includes the first touch region TAR1 for sensing a touch input of, e.g., a finger or a stylus and the second touch region TAR2 for sensing a fine pattern such as a fingerprint. The second touch region TAR2 for recognizing a fingerprint may also be disposed in an active region. The second touch region TAR2 may generally be disposed adjacent to one short side of the display panel 10 and may be surrounded by the first touch region TAR1 as shown in FIG. 16, but embodiments are not limited to this case.

A touch input by a finger or a stylus may be recognized without a large error even using a touch electrode having a size of about 4 m×4 m, for example. In the case of a fingerprint, however, since the distance between valleys of the fingerprint may be about 100 μm to 150 μm, it is difficult to recognize the patterns of the valleys using a touch electrode of the above size. That is, a smaller touch electrode with a higher resolution may be required to recognize a fingerprint.

To this end, as shown in FIG. 17, two types of unit pixel groups including a first-type unit pixel group UPG-T1 and a second-type unit pixel group UPG-T2 may be formed in the first touch region TAR1 and the second touch region TAR2 of the display panel respectively. The second-type unit pixel group UPG-T2 of the second touch region TAR2 may include a smaller number of pixels than the first-type unit pixel group UPG-T1 of the first touch region TAR1. In the illustrated embodiment, the first-type unit pixel group UPG-T1 of the first touch region TAR1 includes nine pixels, and the second-type unit pixel group UPG-T2 of the second touch region TAR2 includes two pixels. However, this is merely an example used for ease of description, and the first-type unit pixel group UPG-T1 of the first touch region TAR1 may include hundreds to hundreds of thousands of pixels, and the second-type unit pixel group UPG-T2 of the second touch region TAR2 may include one pixel or three to four pixels.

The first touch region TAR1 may sense an input of a finger or a stylus. But The first touch region TAR1 may be difficult to sense a fine pattern such as a fingerprint. On the other hand, the second touch region TAR2 may sense a fine pattern such as a fingerprint and, at the same time, may sense an input of a finger or a stylus. That is, the second-type unit pixel group UPG-T2 of the second touch region TAR2 may individually sense a change in capacitance in a fingerprint mode. However, in a general touch mode other than the fingerprint mode, all signals sensed by a plurality of second-type unit pixel groups included in a predetermined area (e.g., the same area as one first-type unit pixel group of the first touch region TAR1) may be added up to sense whether a touch has been made.

Figure 18:
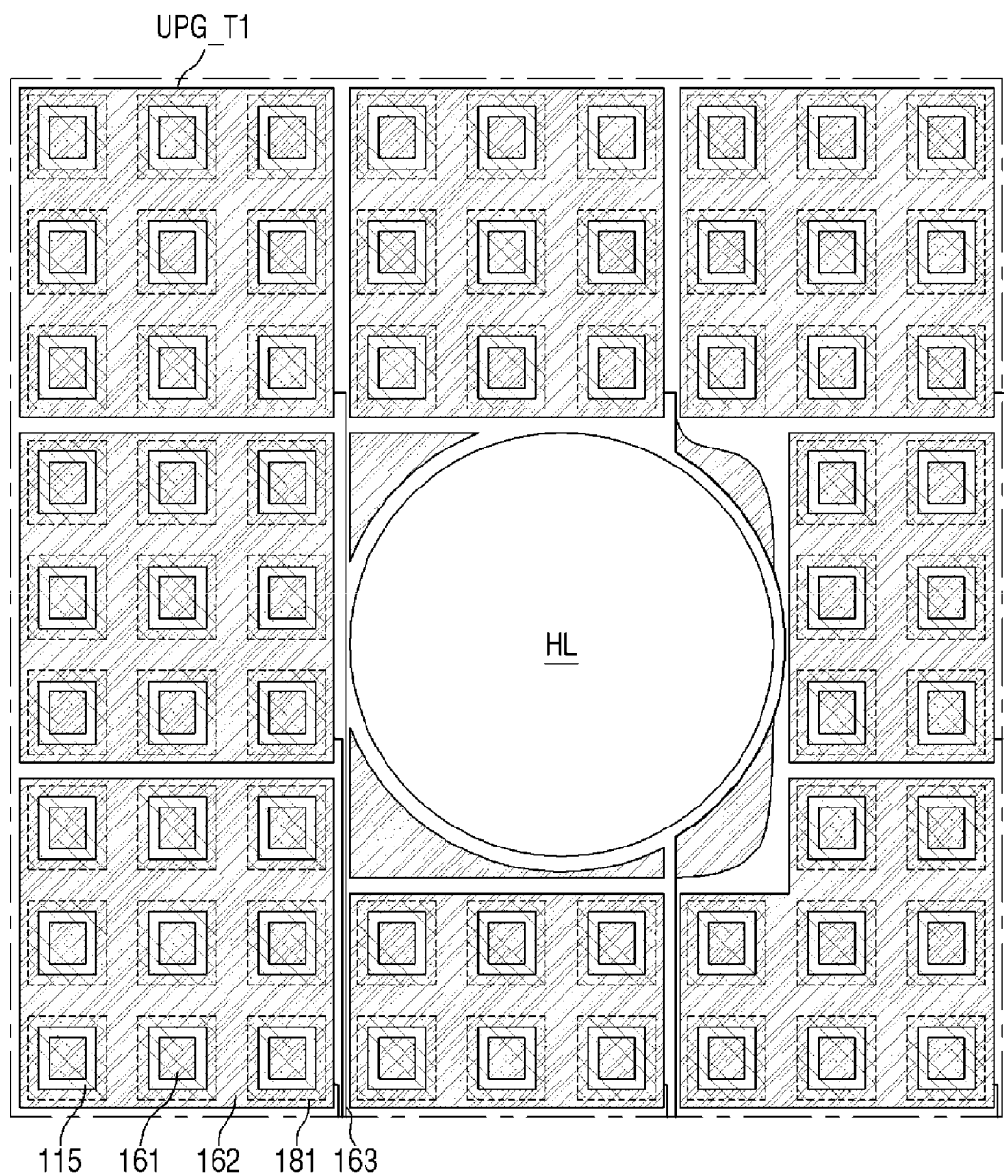
FIG. 18 is a schematic enlarged view of a hole region of the display panel.
Figure 19:
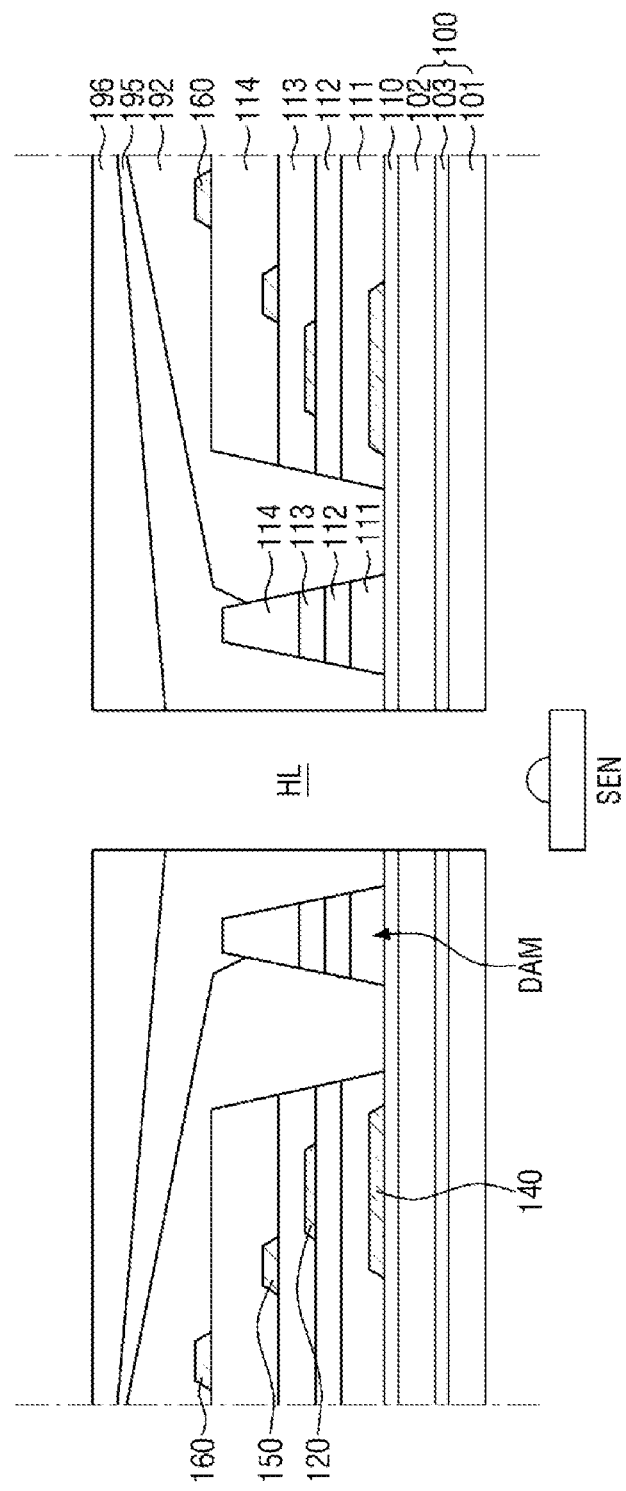
FIG. 19 is a cross-sectional view of the hole region.

FIG. 18 is a schematic enlarged view of a hole region HL of the display panel 10. FIG. 19 is a cross-sectional view of the hole region HL.

Referring to FIG. 18, a plurality of pixels PX may also form a unit pixel group UPG in a portion around the hole region HL. However, since no pixel PX and no electrode layer can be disposed in the hole region HL, the unit pixel group UPG in that portion may have a different shape from those of other portions. For example, the electrode wiring 163 may be designed to bypass the hole region HL.

In the drawing, the pixels PX are relatively large as compared with the hole region HL. However, if the pixels PX are much smaller than the hole region HL in an actual application example, the portion around the hole region HL may be more densely filled with the unit pixel group UPG. Therefore, the areas of both the display region and the touch region may be effectively increased. In some embodiments, the hole region HL may be disposed in one unit pixel group UPG.

A space around the hole region HL without the intermediate layers 170 of the pixels PX may be filled with the auxiliary electrode 162 or electrode wiring 163. Therefore, the auxiliary electrode 162 or the electrode wiring 163 may have a larger line width in that portion and may have a curved pattern shape or a straight bypass line along the profile of the hole region HL. If the portion around the hole region HL is filled with the auxiliary electrode 162 or the electrode wiring 163 that may be shielded.

Referring to FIG. 19, the hole region HL penetrates not only insulating layers and metal layers disposed on the substrate 100 but also the substrate 100. Adam structure DAM is disposed around the hole region HL. The dam structure DAM may include stacked insulating layers including a first insulating layer 111, a second insulating layer 112, a third insulating layer 113 and a fourth insulating layer 114. The insulating layers and the metal layers between the dam structure DAM and each of the pixels PX may be removed except for the substrate 100, thereby forming a groove. At least a portion (e.g., the first organic layer 192) of the thin-film encapsulation layer 190 as shown in FIG. 5 is disposed in the groove. The dam structure DAM may prevent the first organic layer 192 from overflowing into the hole region HL. One or more organic layers may be further disposed on the first organic layer 192 around the hole region HL. For example, a second organic layer 195 is disposed on the first organic layer 192, and a third organic layer 196 is disposed on the second organic layer 195. The second organic layer 195 and the third organic layer 196 may fill and planarize an inclined step around the hole region HL.

Figure 20:
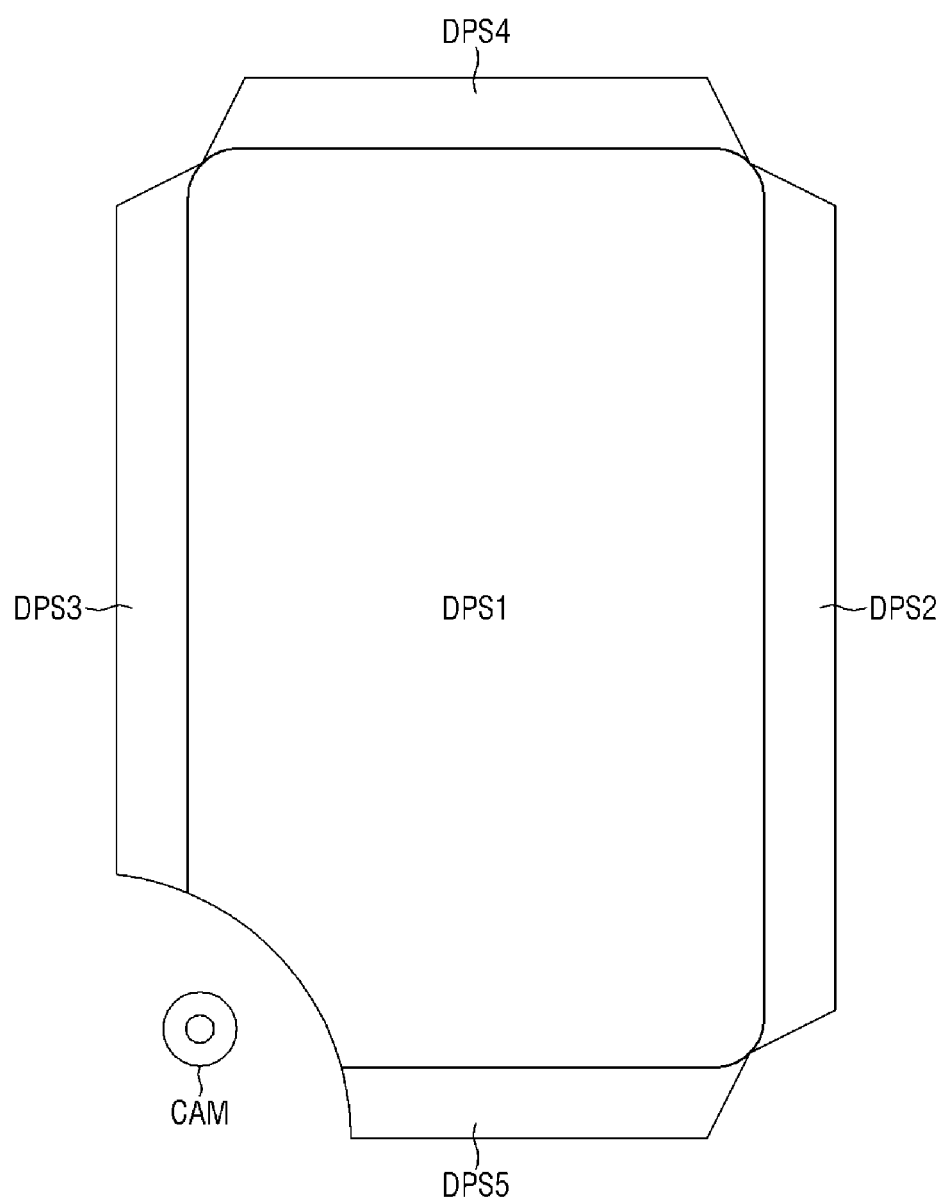
FIG. 20 is a development figure of a display device according to an embodiment.
Figure 21:
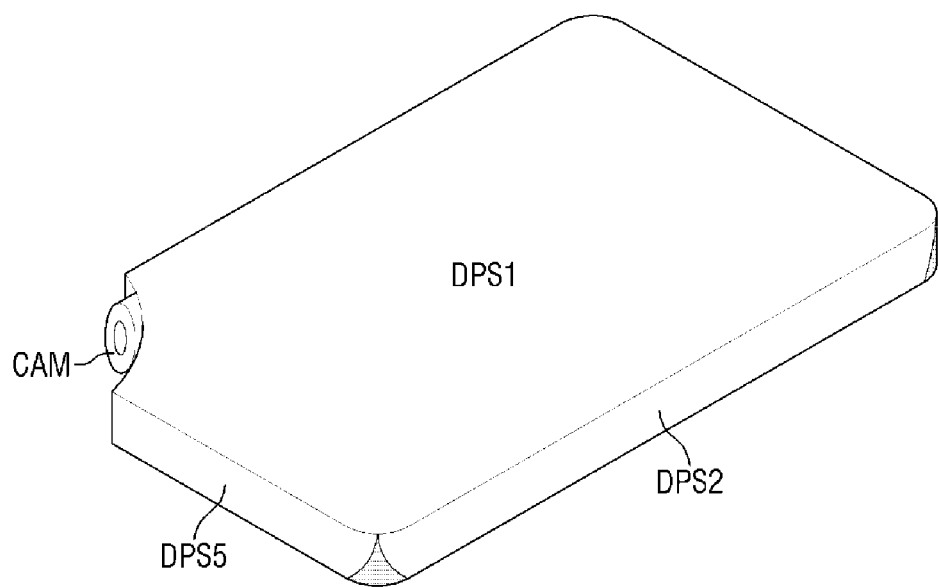
FIG. 21 is a perspective view of the display device of FIG. 20.

FIG. 20 is a development figure of a display device 2 according to an embodiment. FIG. 21 is a perspective view of the display device 2 of FIG. 20.

The embodiment of FIGS. 20 and 21 shows that the display device 2 may be applied as a stereoscopic display device. Referring to FIGS. 20 and 21, the current embodiment is different from the embodiment of FIG. 1 in that the display device 2 includes a plurality of display surfaces DPS1 through DPS5 located in different planes. In the display device 2 which is of a rectangular parallelepiped shape, a first display surface DPS1 may be disposed on a surface of the display device 2, a second display surface DPS2 and a third display surface DPS3 may be disposed on side surfaces adjacent to long sides of the display device 2, and a fourth display surface DPS4 and a fifth display surface DPS5 may be disposed on side surfaces adjacent to short sides of the display device 2.

In an embodiment, a corner portion where side surfaces meet is cut into an L shape, and an element such as a camera CAM is disposed in the cut portion. The camera CAM may be placed to face the same direction as the fifth display surface DPS5, but embodiments are not limited to this case. In an exemplary embodiment, an element such as the camera CAM may be disposed on any one of the display surfaces DPS2 through DPS5 located on the side surfaces of the display device 2.

In the current embodiment, a unit pixel group UPG as discussed above with reference to FIGS. 3 to 5, for example, may be disposed on at least one of the first through fifth display surfaces DPS1 through DPS5. For example, when the unit pixel group UPG is disposed on at least one of the second through fifth display surfaces DPS2 through DPS5 located on the side surfaces and serves as a touch electrode in these portions, the unit pixel group UPG may be used in place of physical buttons such as a power button and a volume button.

Figure 22:
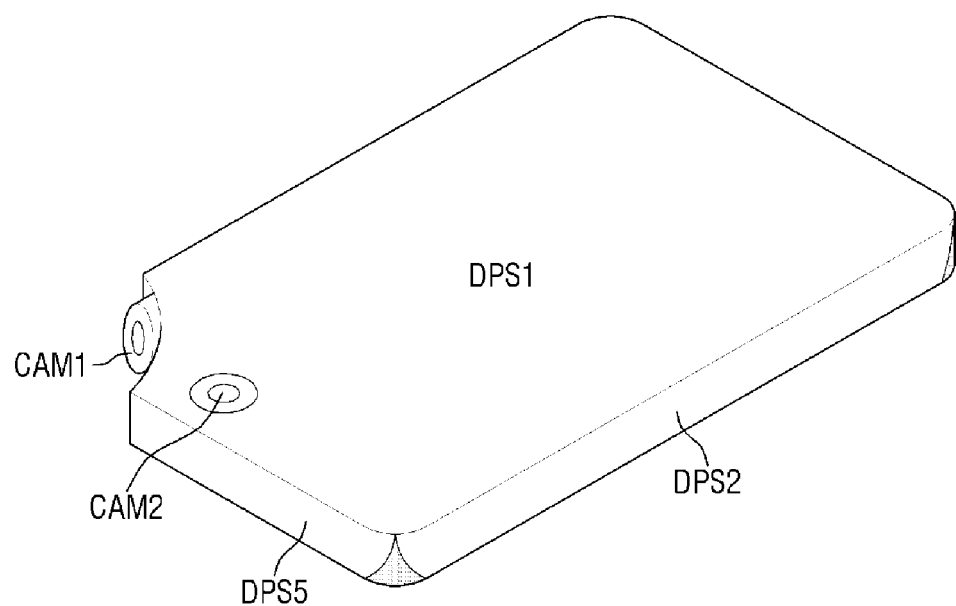
FIG. 22 is a perspective view of a display device according to an embodiment.

FIG. 22 is a perspective view of a display device 2_1 according to an embodiment. FIG. 22 shows that, for example, a camera may also be disposed on a first display surface DPS1 of the display device 2_1 in comparison to the display device 2 of FIG. 21.

Referring to FIG. 22, the current embodiment is substantially the same as the embodiment of FIG. 21 in that the display device 2_1 includes a plurality of display surfaces DPS1 through DPS5, a corner portion where side surfaces meet is cut into an L shape, and a first camera CAM1 is disposed in the cut portion. However, the current embodiment is different from the embodiment of FIG. 21 in that a second camera CAM2 is further installed on the first display surface DPS1. The second camera CAM2 may be disposed in a non-display region of the first display surface DPS1, but may also be disposed in a display region and surrounded by pixels. In an embodiment, a camera hole may be formed in the first display surface DPS1, and the second camera CAM2 may be installed under the camera hole. The camera hole may correspond to the hole region HL described above with reference to FIGS. 18 and 19. In a modified example of the current embodiment, the first camera CAM1 and/or the L-cut shape of the corner portion may be omitted.

Figure 23:
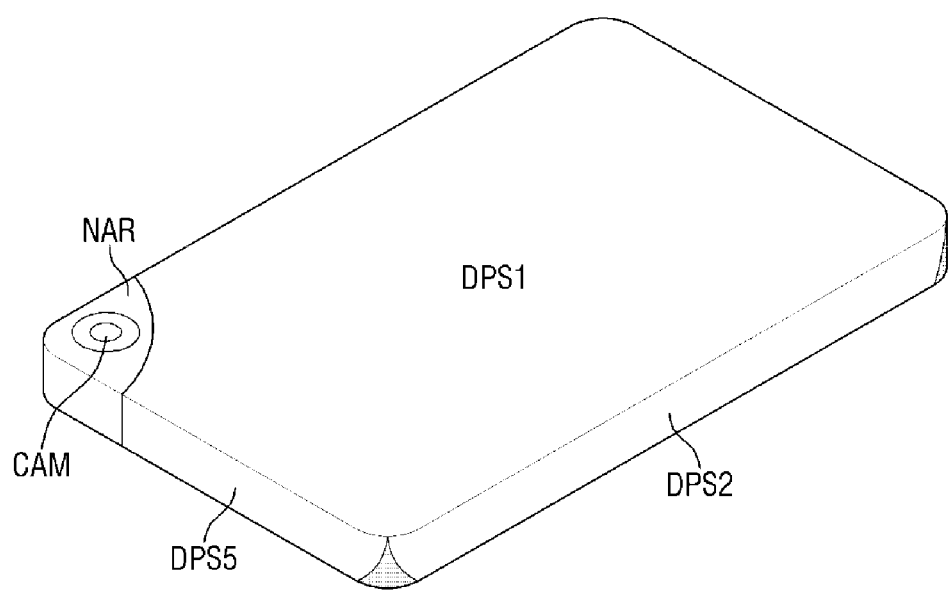
FIG. 23 is a perspective view of a display device according to an embodiment.

FIG. 23 is a perspective view of a display device 2_2 according to an embodiment.

Referring to FIG. 23, the current embodiment is the same as the embodiment of FIG. 21 in that the display device 2_2 includes a plurality of display surfaces DPS1 through DPS5, and a corner portion where side surfaces meet is cut into an L shape. However, the current embodiment is different from the embodiment of FIG. 21 in that a non-active region NAR is disposed in the L-cut region, and a camera CAM is disposed in that region. The camera CAM may be disposed to face the same direction as a first display surface DPS1.

Figure 24:
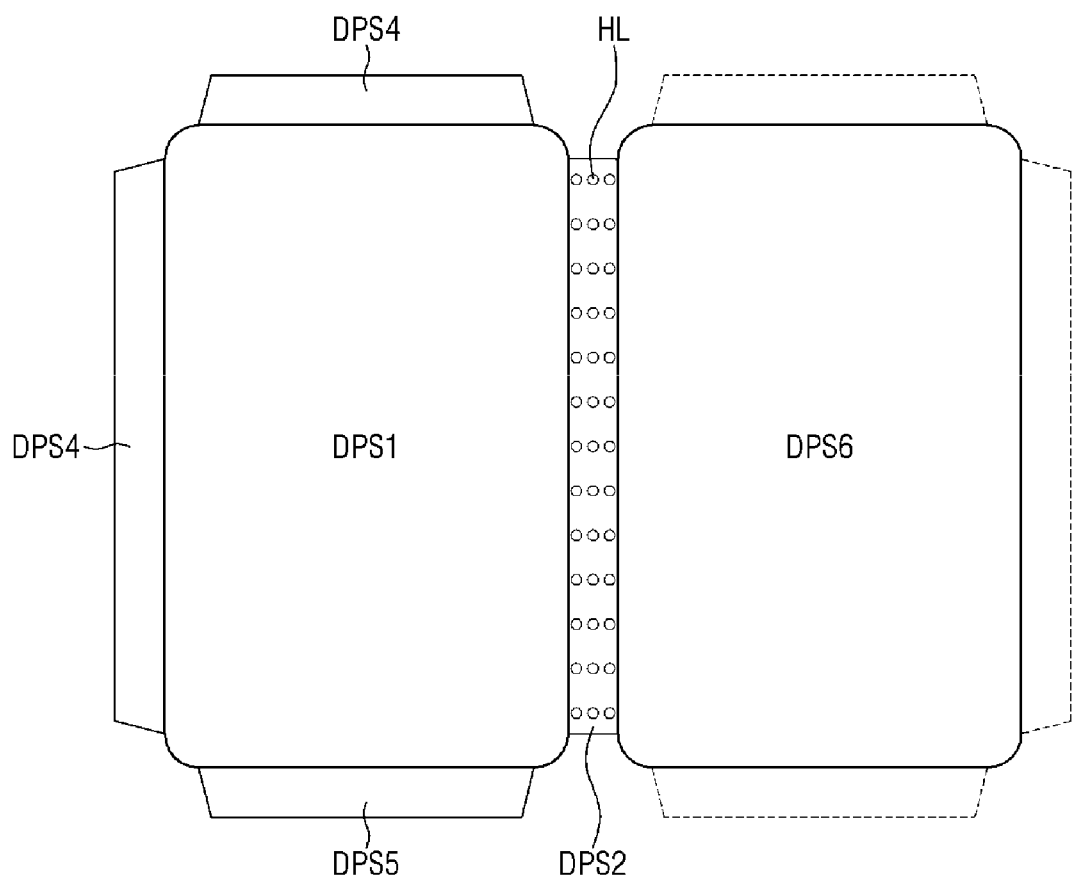
FIG. 24 is a development figure of a display device according to an embodiment.
Figure 25:
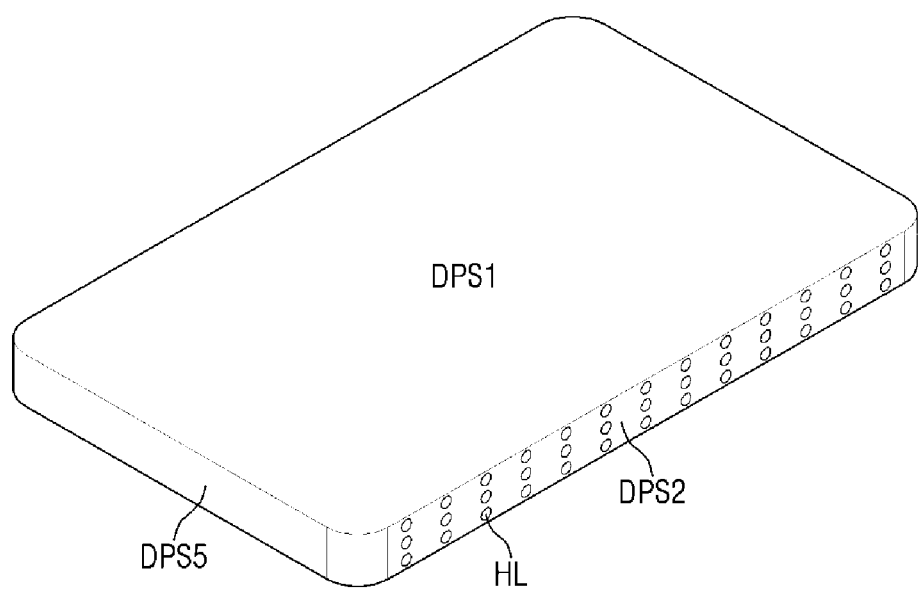
FIG. 25 is a perspective view of the display device of FIG. 24.

FIG. 24 is a development figure of a display device 3 according to an embodiment. FIG. 25 is a perspective view of the display device 3 of FIG. 24.

The embodiment of FIGS. 24 and 25 shows that the display device 3 may include a sixth display surface DPS6, in addition to the first through fifth display surfaces DPS1 to DPS5, on a surface other than the first through fifth display surfaces DPS1 to DPS5. A hole region HL may be formed in plural and may be formed on at least one of the display surfaces DPS1 through DPS6. The hole region HL may be utilized as, for example, a speaker of the display device 3. In an example embodiment, the hole region HL is disposed on the second display surface DPS2 located on a side surface, but embodiments are not limited to this case. Even when the hole region HL is formed in the second display surface DPS2, a unit pixel group UPG may be placed up to the vicinity of the hole region HL as described above with reference to FIGS. 18 and 19, and this portion may be effectively shielded by expanding an auxiliary electrode 162 or an electrode wiring 163.

Each portion shown in dotted lines in FIG. 24 is a portion that may overlap another display surface at the time of assembly. In the display device 3, a display surface may also be provided in that portion so that two or more display surfaces overlap, or a dummy region may be disposed in that portion and attached to a corresponding display surface.

In a display device according to an embodiment, a second electrode of a light emitting element may alternately serve as one of a common electrode and a touch electrode. For example, the second electrode may have dual functions of the common electrode for a pixel and the touch electrode for a touch sensor, but may serve as one of the two functions at a time. Therefore, the manufacturing process may be simplified. In addition, a touch region may be formed close to the periphery of a hole region in a display device including the hole region in an active region.

However, the effects of the embodiments are not restricted to the one set forth herein. The above and other effects of the embodiments will become more apparent to one of daily skill in the art to which the embodiments pertain by referencing the claims.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:
1. A display device comprising:
 a substrate which comprises an active region in which a plurality of pixels are arranged;
 a first electrode layer which is disposed on the substrate and comprises a first electrode disposed in each pixel and an auxiliary electrode spaced apart from the first electrode and disposed along a boundary of each pixel;
 an intermediate layer which is disposed on the first electrode and comprises a light emitting layer; and
 a second electrode which is disposed on the intermediate layer, disposed in each pixel, and electrically connected to the auxiliary electrode; and
 wherein a plurality of unit pixel groups, each comprising one or more pixels, are defined on the substrate, the respective second electrodes of the pixels belonging to each unit pixel group are electrically connected to each other by the auxiliary electrode, and the auxiliary electrodes belonging to different unit pixel groups are electrically separated from each other.

2. The display device of claim 1, wherein the first electrode layer further comprises an electrode wiring which is electrically connected to the auxiliary electrode of each unit pixel group.

3. The display device of claim 2, wherein the respective electrode wirings of the unit pixel groups are commonly connected to a common voltage providing unit and individually connected to a touch driving unit.

4. The display device of claim 3, further comprising a power supply wiring which is connected to the electrode wiring and is connected to the common voltage providing unit via a first switch, wherein the electrode wiring of each unit pixel group comprises a second switch, and the electrode wiring of each unit pixel group is connected to the touch driving unit via the second switch.

5. The display device of claim 4, wherein the first switch and the second switch are not simultaneously turned on.

6. The display device of claim 1, wherein, in a plan view, the intermediate layer is larger than the first electrode, and the second electrode is larger than the intermediate layer.

7. The display device of claim 6, wherein the intermediate layer and the second electrode have the same planar shape.

8. The display device of claim 6, further comprising a passivation layer which is disposed in each pixel and covers the second electrode.

9. The display device of claim 1, further comprising a bank layer which is disposed on the substrate and surrounds and exposes the first electrode in each pixel.

10. The display device of claim 9, wherein the bank layer is disposed between the first electrode and the auxiliary electrode.

11. The display device of claim 10, wherein the auxiliary electrode has a lattice pattern.

12. The display device of claim 1, wherein the substrate comprises a first touch region and a second touch region, wherein the number of pixels included in each unit pixel group of the second touch region is smaller than the number of pixels included in each unit pixel group of the first touch region.

13. The display device of claim 12, wherein the first touch region is a region for recognizing a touch of a finger or a stylus, and the second touch region is a fingerprint recognition region.

14. The display device of claim 1, further comprising a hole region disposed in the active region, wherein a unit pixel group is disposed around the hole region.

15. The display device of claim 1, comprising a plurality of display surfaces located in different planes, wherein the unit pixel groups are disposed on at least one of the display surfaces.

16. A display device comprising:
 a substrate which comprises an active region in which a plurality of pixels are arranged;
 a light emitting element which is disposed on the substrate, is disposed in each pixel, and comprises a first electrode, an intermediate layer and a second electrode; and
 a plurality of touch electrodes which are disposed over the pixels,
 wherein the first electrode, the intermediate layer and the second electrode are patterned to be separate for each pixel, and each of the touch electrodes comprises a plurality of second electrodes.

17. The display device of claim 16, wherein each of the touch electrodes further comprises an auxiliary electrode which electrically connects the second electrodes separated from each other.

18. The display device of claim 17, wherein each of the touch electrodes further comprises an electrode wiring which is connected to the auxiliary electrode.

19. The display device of claim 18, wherein the auxiliary electrode and the electrode wiring are disposed on the same layer as the first electrode.

20. The display device of claim 19, wherein the second electrode receives any one of a common voltage and a touch signal.

\* \* \* \* \*